United States Patent [19]

Uchida

[11] Patent Number: 5,757,832
[45] Date of Patent: May 26, 1998

[54] OPTICAL SEMICONDUCTOR DEVICE, DRIVING METHOD THEREFOR AND LIGHT SOURCE AND OPITCAL COMMUNICATION SYSTEM USING THE SAME

[75] Inventor: Mamoru Uchida, Yokohama, Japan

[73] Assignee: Canon Kabushiki Kaisha, Tokyo, Japan

[21] Appl. No.: 637,453

[22] Filed: Apr. 25, 1996

[30] Foreign Application Priority Data

Apr. 27, 1995 [JP] Japan ................................. 7-127161
Sep. 11, 1995 [JP] Japan ................................. 7-258103

[51] Int. Cl.$^6$ ................................. H01S 3/19; G02B 6/12
[52] U.S. Cl. ................................. 372/45; 372/43; 372/50; 372/27; 372/106; 372/96; 385/11; 385/14
[58] Field of Search ................................. 372/27, 43, 44, 372/45, 50, 106, 98, 96, 92; 385/11, 14

[56] References Cited

U.S. PATENT DOCUMENTS

| 5,007,063 | 4/1991 | Kahen | 372/45 |
| 5,023,878 | 6/1991 | Berthold et al. | 372/20 |
| 5,117,469 | 5/1992 | Cheung et al. | 385/11 |
| 5,249,244 | 9/1993 | Uchida | 385/15 |
| 5,396,508 | 3/1995 | Bour et al. | 372/27 |
| 5,497,390 | 3/1996 | Tanaka et al. | 372/50 |
| 5,511,083 | 4/1996 | D'Amato et al. | 372/27 |
| 5,586,131 | 12/1996 | Ono et al. | 372/19 |

FOREIGN PATENT DOCUMENTS

| 0 591 864 | 4/1994 | European Pat. Off. | 372/43 X |
| 62-42593 | 2/1987 | Japan | 385/43 X |
| 62-144426 | 6/1987 | Japan | 385/43 X |
| 2159781 | 6/1990 | Japan | 385/43 X |
| 2246393 | 10/1990 | Japan | 385/43 X |

OTHER PUBLICATIONS

Knüpfer, B., et al., "Polarization–Insensitive High–Contrast GaAs/AlGaAs Waveguide Modulator Based on the Franz–Keldysh Effect", IEEE Photonics Technology Letters, vol. 5, No. 12, pp. 1386–1388 (Dec. 1993).

*Primary Examiner*—Brian Healy
*Attorney, Agent, or Firm*—Fitzpatrick, Cella, Harper & Scinto

[57] ABSTRACT

An optical semiconductor device, such as an optical filter and an oscillation polarization selective semiconductor device for switching oscillation polarization modes between two different polarization modes, includes at least one gain region, at least one lossy region, a first control unit for controlling the gain region to control a gain spectrum of the device, and a second control unit for controlling the lossy region to control a cavity loss spectrum of the device such that a polarization dependency with respect to the two different polarization modes is imparted to the cavity loss spectrum. The gain region includes a light waveguide with an active layer which allows the two different polarization modes. The lossy region includes a light waveguide which allows the two different polarization modes.

75 Claims, 19 Drawing Sheets

5,757,832

OPTICAL SEMICONDUCTOR DEVICE, DRIVING METHOD THEREFOR AND LIGHT SOURCE AND OPITCAL COMMUNICATION SYSTEM USING THE SAME

BACKGROUND OF THE INVENTION

1. Field of the Invention

The present invention relates to optical semiconductor devices, such as an optical filter, a tunable semiconductor laser, and an oscillation polarization selective semiconductor laser whose mode state of polarization of oscillated light can be switched, which are suitable for a light source and the like used in optical communications, optical information processing, such as an optical memory, optical operations and optical computers, and so forth. The present invention further relates to a driving method for driving the optical semiconductor device and an optical communication system using the optical semiconductor device as a light source in a transmitter or the like.

2. Related Background Art

In recent years, increased optical transmission capacity in the field of optical communication has become desirable, and the use of a semiconductor laser or the like as a light source in a transmitter has satisfied such desire and solved a number of existing problems, to some extent. However, the phenomenon called chirping has not yet been satisfactorily solved. In chirping, the refractive index fluctuates due to an uneven distribution of carriers in an active layer in a device when high-speed intensity modulation of the device is performed, and the oscillation waveform of oscillated signal light is distorted. In general, problems caused by a large chirping are as follows: An error rate increases as the modulation speed increases, and the modulation speed of a device and the transmission distance of optical communication will be limited. A line width of a device increases as the modulation speed increases, and hence, the wavelength multiplexing number of optical communication will be limited since a wavelength filter with a wide pass band needs to be used for a signal having such increased line width.

In one of prime methods for solving the chirping at present, a semiconductor laser is continuously driven (CW driving) and the continuous light wave from the laser is intensity-modulated by an external modulator which uses a dielectric material, a semiconductor or the like. This method, however, has drawbacks in that there are limitations to down-sizing and cost reduction of the device and in that flexibility of optical networks (capability of simultaneous transmission of signals whose speeds are greatly different, etc.) is not high.

Furthermore, another system has been proposed, in which the polarization mode of oscillated light from a distributed feedback (DFB) laser is switched between light waves in TE (transverse electric) and TM (transverse magnetic) modes and only one of TE and TM modes is selected for transmission (see, for example, Japanese Patent Laid-Open Nos. 62(Showa)-42593, 62(Showa)-144426 and 2(Heisei)-159781). Such a polarization modulation method, as illustrated in FIG. 1, has characteristics that the oscillation polarization is changed from TM mode to TE mode at a given current point, and the threshold gain is selectively reached between TE mode and TM mode by a signal current with a constant current for simultaneous oscillation of TE and TM modes being injected as a bias point. The polarization-modulated light from the semiconductor laser is transmitted through a polarizer and only light polarized in a given direction is transmitted over a transmission line. In such a polarization modulation method, carrier fluctuation accompanying the modulation can be notably decreased in the device since light density in the semiconductor laser remains unchanged during the modulation (i.e., a driving current is always almost constant and not "ON-OFFed"). However, no specific structure for such a laser is disclosed in either of those prior art references.

Furthermore, in the case of a prior art direct polarization modulation system, since only the polarization dependency or sensitivity of gain is mainly used, it is difficult to reduce a difference between threshold gains of TE and TM modes. Accordingly, the following problems occur:

(1) There exist only narrow ranges with respect to driving current, light output, operation temperature, oscillation wavelength, extinction ratio and so forth, in which the direct polarization modulation can be stably performed.

(2) A degree of freedom in design is limited and required preciseness for fabrication is needed to be high, so yield of the device is low.

(3) The lifetime of a device is short since its operation current density is relatively large.

(4) The oscillation spectral line width of a semiconductor laser used as a transmitter is widened and unstable, and hence heavy burden is imparted to a wavelength filter on a receiver side in an optical communication system.

Moreover, improved wavelength control, such as wavelength tunable property and wavelength stability, has been longed to achieve optical comunication with increased capacity. Japanese Patent Laid-Open No. 2(Heisei)-246393 discloses technology of such wavelength control. However, technology has not yet been proposed, which achieves both of favorable wavelength control and reduced chirping.

Further, as a tunable optical filter which can co-operate with a light source for wavelength division multiplexing, only an optical semiconductor filter with a considerable polarization sensitivity and a filter of a non-semiconductor type with a wide pass band have been proposed. Thus, a tunable device, which can satisfy also the desire of improved capacity, has not yet been developed.

SUMMARY OF THE INVENTION

It is an object of the present invention to provide optical semiconductor devices, such as an oscillation polarization selective semiconductor laser in which chirping is greatly reduced and which can be readily fabricated, a tunable semiconductor laser with a reduced chirping and a tunable semiconductor filter whose transmission property is insensitive to polarization, a driving method for driving the optical semiconductor device, and an optical communication system and the like using the optical semiconductor device.

The object of the present invention is achieved by the following optical semiconductor devices, driving methods for driving the optical semiconductor device, and optical communication systems and the like using the optical semiconductor device.

According to one aspect of the present invention, there is provided an optical semiconductor device, such as an oscillation polarization selective semiconductor laser for switching an oscillation polarization mode between two different polarization modes and an optical semiconductor filter, which includes at least one gain region, at least one lossy region, a first control unit for controlling the gain region to control a gain spectrum of the laser, and a second control unit for controlling the lossy region to control a cavity loss spectrum of the laser such that a polarization dependency with respect to the two different polarization modes is imparted to the cavity loss spectrum. The gain region includes a light waveguide with an active layer which allows the two different polarization modes. The lossy region includes a light waveguide which allows the two different polarization modes. In this structure, the polarization dependency may impart loss only to a predetermined polarization mode.

More specifically, the following structures are possible. A distributed feedback reflector may be formed along at least part of the light waveguide to form a distributed feedback reflector type device. A distributed Bragg reflector region may be serially arranged with the gain region and the lossy region along a cavity direction. The gain region and the lossy region may be electrically independent from each other and optically coupled to each other through a common optical waveguide layer. At least part of the light waveguide in the lossy region may have a super-lattice structure, such as a quantum well structure, which has quantum confinement Stark effect (QCSE). The light waveguide in the lossy region may include a lossy layer, and the active layer and the lossy layer may comprise a common strained quantum well layer. The two different polarization modes may be respectively transverse electric (TE) and magnetic (TM) modes, and a pitch of the distributed reflector may be set such that Bragg wavelength for the TM mode is positioned at a gain peak wavelength of the gain spectrum. At least part of the light waveguide in the lossy region may have a structure which has Franz-Keldysh effect. In those structures, the first control unit may control a density of carriers injected into the active layer in the gain region, or/and the second control unit may control a voltage applied across the lossy region.

Further, at least part of the lossy region may include a metal loaded thereon. In this structure, the first control unit may control a density of carriers injected into the active layer in the gain region.

Furthermore, the gain region may be designed such that a polarization dependency is imparted to gains for the two different polarization modes. The polarization dependency may impart a gain only to a predetermined polarization mode. The active layer in the gain region may have an asymmetric multiple quantum well structure which includes a plurality of sets of quantum wells and barriers, and the structure of one set of the well and the barrier is different from the structure of the other set in at least one of layer thicknesses, compositions and strains of the well and the barrier.

Moreover, the distributed reflector may be formed all over the laser along the cavity direction. The distributed reflector may be a diffraction grating with a phase shift section. Antireflection coatings may be provided on opposite end facets of the laser.

In a device with the distributed Bragg reflector region serially arranged with the gain region and the lossy region, an antireflection coating may be provided on an end facet of the distributed Bragg reflector region.

Further, a tuning unit for tuning a wavelength (such as oscillation wavelength and filtering wavelength) independently from the first control unit and the second control unit, may be provided. The tuning unit may include a wavelength control region arranged serially with the gain region and the lossy region, and the wavelength control region includes a tuning layer and a distributed Bragg reflector. The tuning unit may include a wavelength tuning layer formed in parallel with the gain region and the lossy region, and a distributed feedback reflector formed along a cavity direction may be provided. The wavelength tuning layer may have a multiple quantum well structure.

Further, a phase control region for controlling the phase of propagated light may be provided.

According to another aspect of the present invention, there is provided a light source apparatus which includes an oscillation polarization selective semiconductor laser of the present invention discussed above, and a polarization mode selector, such as a polarizer, disposed in front of a light emission end surface of the semiconductor laser for selecting only a signal having a predetermined polarization mode.

According to another aspect of the present invention, there is provided an optical communication system for transmitting a signal from a transmitter side to a receiver side over a transmission line, which includes an oscillation polarization selective semiconductor laser of the present invention discussed above, and a polarization mode selector, such as a polarizer, disposed in front of a light emission end surface of the semiconductor laser for selecting only a signal having a predetermined polarization mode and transmitting the signal over the transmission line.

According to another aspect of the present invention, there is provided an optical communication system for transmitting a signal from a transmitter side to a receiver side over a transmission line, which includes an optical semiconductor filter of the present invention discussed above, and a photodetector disposed at the back of the semiconductor filter to detect the signal transmitted over the transmission line and through the filter.

According to another aspect of the present invention, there is provided an optical communication system for transmitting a signal from a transmitter side to a receiver side over a transmission line, which includes an oscillation polarization selective semiconductor laser of the present invention discussed above, and a receiver for receiving the two kinds of signal light waves simultaneously. In this system, the oscillation polarization selective semiconductor laser switches an oscillation polarization mode between two different polarization modes and simultaneously transmits the two kinds of signal light waves whose polarization modes are different from each other.

According to still another aspect of the present invention, there is provided a modulation method for driving an oscillation polarization selective semiconductor laser of the present invention, in which current injected into the gain region or regions and a voltage applied to the lossy region are adjusted such that threshold gains for the two different polarization modes are equal to each other in a stationary state, and then at least one of control of a density of carriers injected into the active layer in the gain region or regions by the first control unit and control of a voltage applied across the lossy region by the second control unit is performed.

According to still another aspect of the present invention, there is provided a driving method for driving an optical semiconductor device of the present invention, in which a current injected into the gain region or regions and a voltage applied to the lossy region are adjusted such that threshold gains for the two different polarization modes are equal to each other in a stationary state, and at least one of control of a density of carriers injected into the active layer in the gain region or regions by the first control unit and control of a voltage applied across the lossy region by the second control unit is performed.

According to still another aspect of the present invention, there is provided a driving method for driving an optical semiconductor device of the present invention, in which a current injected into the gain region or regions and a voltage applied to the lossy region are adjusted such that threshold gains for the two different polarization modes are equal to each other in a stationary state, at least one of control of a density of carriers injected into the active layer in the gain region or regions by the first control unit and control of a voltage applied across the lossy region by the second control unit is performed, and an effective refractive index of the light waveguide is changed by one of current injection into and voltage application to the light waveguide by the tuning unit.

According to still another aspect of the present invention, there is provided a driving method for driving an optical semiconductor device of the present invention, in which a current injected into the gain region or regions and a voltage applied to the lossy region are adjusted such that threshold gains for the two different polarization modes are equal to each other in a stationary state, at least one of control of a density of carriers injected into the active layer in the gain region or regions by the first control unit and control of a voltage applied across the lossy region by the second control unit is performed, and an effective refractive index of the tuning layer is changed by one of current injection into and voltage application to the tuning layer by the tuning unit.

The modulation or driving principle of an optical semiconductor device of the present invention, such as an oscillation polarization selective semiconductor laser will be described. In the device, the oscillation or filtering wavelengh is determined by the oscillation or filtering conditions which are represented as:

$$\Gamma \cdot g_{th} = \Gamma \cdot \alpha_{in} + \alpha_M + \alpha_{SC} \quad (1)$$

$$\alpha_M = 1/2L_{eff} \ln (1/R_1 \cdot 1/R_2)$$

$$\exp(i \cdot (2n_{eff} L_{eff}/\lambda + \phi)) = 0 \quad (2)$$

where $\Gamma$ is the light confinement coefficient of an active layer, $g_{th}$ is the threshold gain, $\alpha_{in}$ is the internal loss, $\alpha_M$ is the reflection loss, $\alpha_{SC}$ is the other miscellaneous loss (i.e., scattering loss and coupling loss), $R_1$ and $R_2$ are effective reflectances with respect to opposite directions viewed from a point in the cavity, $n_{eff}$ is the effective refractive index of a waveguide, $L_{eff}$ is the effective cavity length, $\lambda$ is the oscillation or filtering wavelength and $\phi$ is the phase. Those parameters respectively have polarization dependencies.

In addition, the device has different polarization modes (for example, TE mode and TM mode), and their threshold gains should be equal to each other:

$$\Gamma^{TE} \cdot g_{th}^{TE} = \Gamma^{TM} \cdot g_{th}^{TM} \quad (3)$$

In the device of this invention, gain spectrum and cavity loss spectrum can be independently controlled, so that characteristics of the device are improved and a degree of freedom in design is increased. Thus, fabrication yield is improved.

More specifically, relations (1)–(3) can be readily satisfied by controlling polarization dependencies of both of the gain region and the lossy region. Furthermore, an effective refractive index of the light waveguide can be changed by the tuning or wavelength control region, such as a tuning layer, formed independently from the gain control means and the loss control means, and the wavelength determined by relation (2) can be controlled by the tuning means independently from the the gain control means and the loss control means. This is in sharp contrast to a prior art device in which the gain control and the wavelength control are not independent from each other.

These advantages and others will be more readily understood in connection with the following detailed description of the preferred embodiments in conjunction with the drawings.

DESCRIPTION OF THE PREFERRED EMBODIMENTS

First Embodiment

A first embodiment of the present invention will be described with reference to FIGS. 2 through 5. The first embodiment is directed to an oscillation polarization selective semiconductor laser having a first gain region, a second gain region and a lossy region which are respectively arranged along a cavity or light propagation direction. The respective regions are electrically independent from each other, but optically coupled to each other through a common optical waveguide layer 103.

Figure 1:
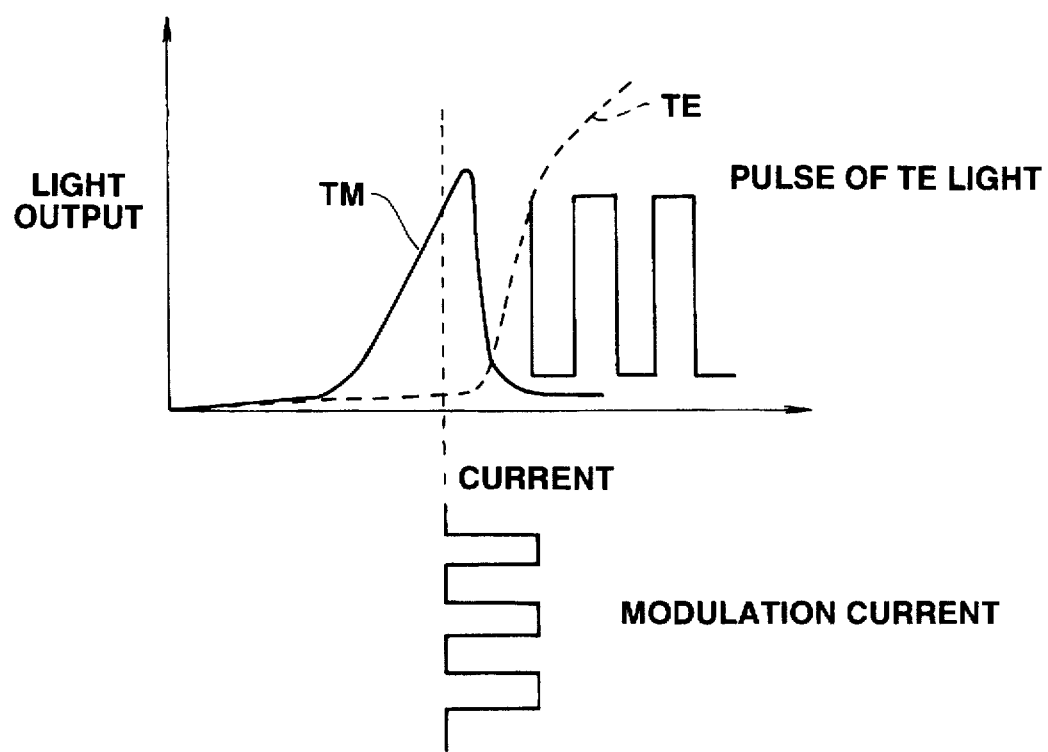
FIG. 1 is a graph for explaining a prior art semiconductor laser whose oscillation polarization mode can be switched between TE and TM modes.
Figure 2:
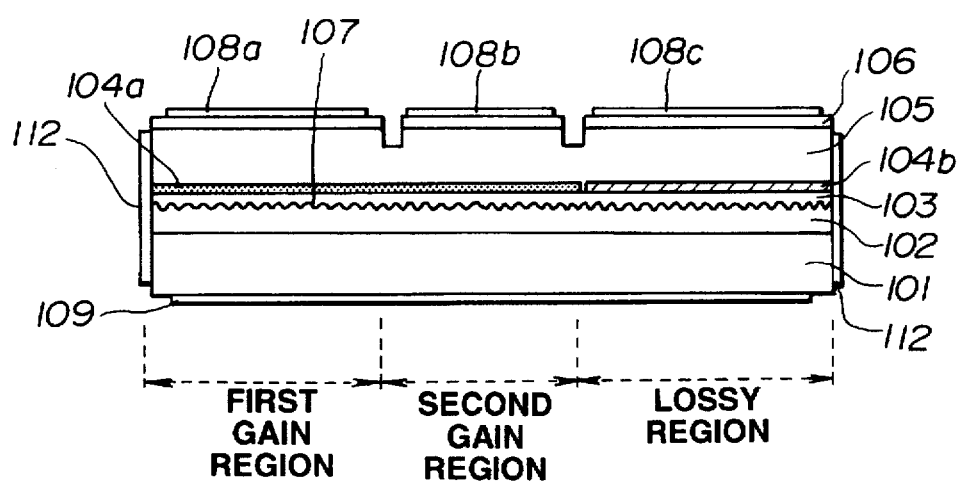
FIG. 2 is a longitudinal cross-sectional view taken along a cavity direction showing the structure of a first embodiment of an oscillation polarization selective semiconductor laser according to the present invention.

As shown in FIG. 2, the semiconductor laser of this embodiment includes an n-type InP substrate 101, an n-type InP cladding layer 102, the n-type InGaAsP lower optical waveguide layer 103, an undoped InGaAsP active layer 104a, an undoped InGaAsP lossy layer 104b, a p-type InP cladding layer 105, a p-type InGaAsP contact layer 106, positive or p-side electrodes 108a, 108b and 108c, and a negative or n-side electrode 109. A grating 107 is formed at a boundary between the n-type cladding layer 102 and the n-type optical waveguide layer 103. The grating 107 has a phase shift section (or some sections). Antireflection (AR) coatings 112 are provided on opposite end facets. The pitch of the grating 107 is set such that its Bragg wavelength for the TM mode is positioned at a gain peak wavelength. In this embodiment, the active layer 104a in the first and second gain regions has the same structure as that of the lossy layer 104b in the lossy region.

Figure 3:
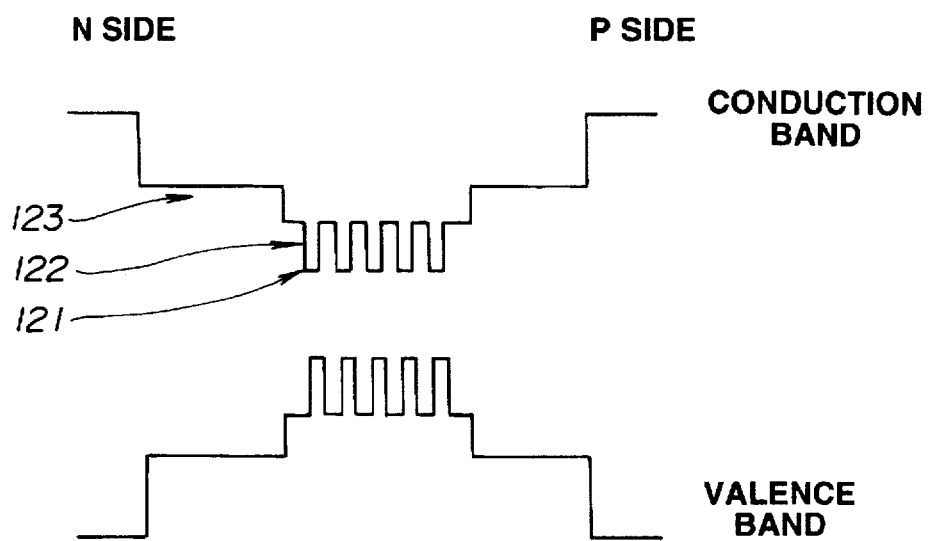
FIG. 3 is a diagram of the energy band structure of an active layer and layers adjacent thereto or a lossy layer and layers adjacent thereto formed in the first embodiment and other embodiments.

Each of the active layer 104a and the lossy layer 104b consists of five InGaAs well layers 121 (thickness: 10 nm and tensile strain: 1.0%), InGaAsP barrier layers 122 (thickness: 10 nm and composition wavelength: 1.1 μm) and a pair of InGaAsP SCH (separate confinement heterostructure) layers 123 (thickness: 100 nm and composition wavelength: 1.2 μm). Energy band gap structures of the active layer 104a and the lossy layer 104b are illustrated in FIG. 3.

Figure 4:
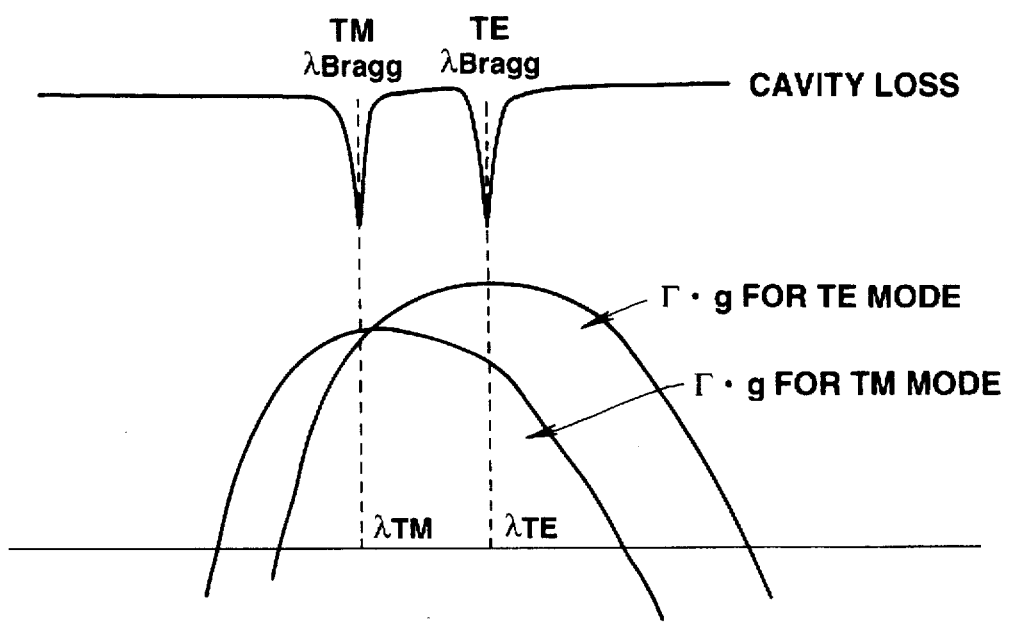
FIG. 4 is a graph illustrating the relationship between gains (more accurately $\Gamma \cdot g$) for TE and TM modes and cavity losses ($\Gamma \cdot \alpha_{in} + \alpha_M + \alpha_{SC}$) at the time when carriers are uniformly injected into a gain region or gain regions of the first embodiment and other embodiments.

The operation principle of this embodiment will be described. FIG. 4 illustrates the relationship between gains (or more precisely, $\Gamma \cdot g$) and cavity losses ($\Gamma \cdot \alpha_{in} + \alpha_M + \alpha_{SC}$) for the TE mode and the TM mode at the time when carriers (about $10^{18}$ cm$^{-3}$) are uniformly injected into the first gain region and the second gain region. The abscissa indicates wavelength. $\lambda_{Bragg}^{TE}$ and $\lambda_{Bragg}^{TM}$ respectively indicate Bragg wavelengths for the TE and TM modes, and $\lambda^{TE}$ and $\lambda^{TM}$ respectively indicate gain peak wavelengths for the TE and TM modes. Gain spectra or profiles for the TE and TM modes differ from each other because of the band structure of the strained quantum well active layer 104a.

It is difficult to switch oscillation light of this DFB laser between the TE mode and the TM mode only by establishing different gain profiles for the TE and TM modes. Therefore, in a prior art device, strict design preciseness is required and a range in which the polarization selective operation is possible is narrow.

Figure 5:
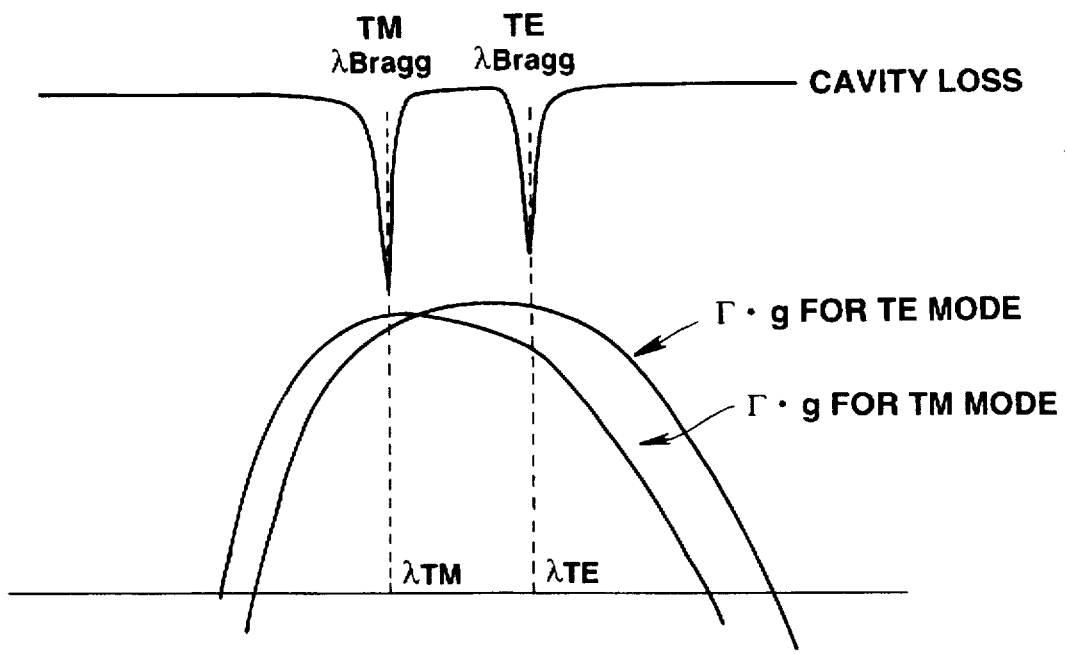
FIG. 5 is a graph illustrating the relationship between gains (more accurately $\Gamma \cdot g$) for TE and TM modes and cavity losses ($\Gamma \cdot \alpha_{in} + \alpha_M + \alpha_{SC}$) at the time when carriers are unevenly injected into a gain region or gain regions of the first embodiment and other embodiments to change the correlation of gains for TE and TM modes and a reverse voltage is applied to a lossy region.

FIG. 5 illustrates the relationship between gains (or more precisely, $\Gamma \cdot g$) and cavity losses ($\Gamma \cdot \alpha_{in} + \alpha_M + \alpha_{SC}$) for the TE mode and the TM mode at the time when carriers are unevenly injected into the first and second gain regions to change the gain correlation between the TE mode and the TM mode from that illustrated in FIG. 4 and a reverse voltage (e.g., about −5 V) is applied across the lossy region. The peak value of cavity loss spectrum for the TM mode is smaller than that for the TE mode due to QCSE in the lossy layer 104b. Thus, relation (3) can be readily satisfied by controlling the cavity loss spectrum as well as the gain spectrum.

After the currents injected into the first gain region and the second gain region and the voltage applied to the lossy region are adjusted so that relation (3) is satisfied in a stationary state, oscillation polarization modulation can be performed by one of the following methods:

(1) A signal is applied to the lossy region as a voltage. This method features that high-speed modulation is possible due to QCSE and that the line width of oscillation light can be extremely narrowed since the carrier distribution remains unchanged in the cavity.

(2) A signal is superposed on a bias current injected into at least one of the first gain region and the second gain region. This method features that a modulation circuit can be simplified.

(3) A combination of the methods (1) and (2).

Figure 6:
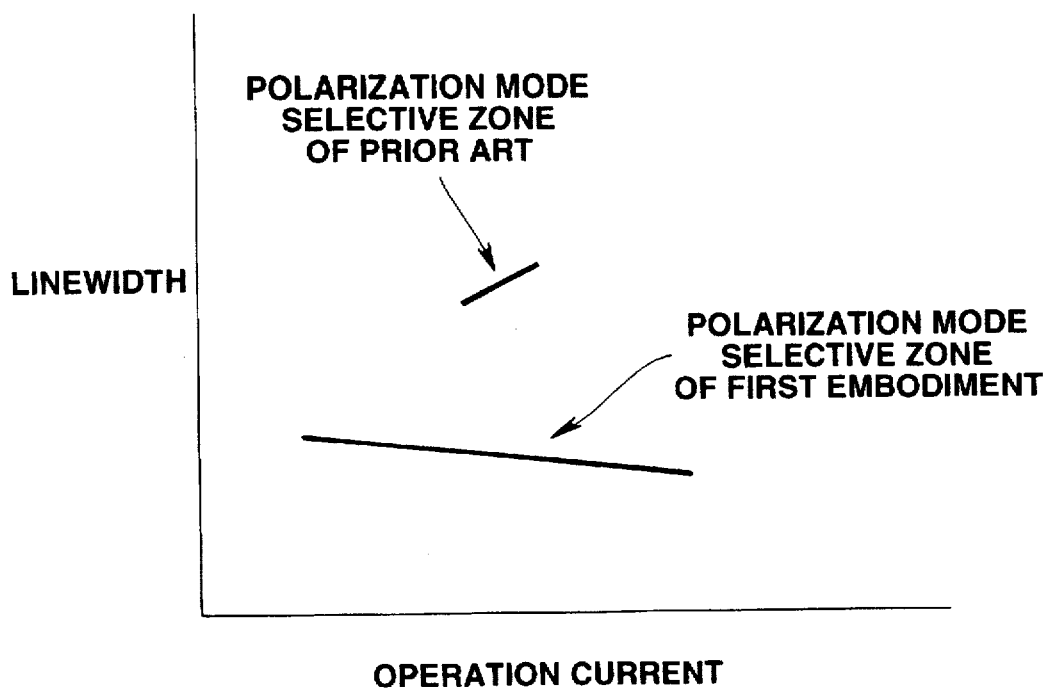
FIG. 6 is a graph schematically illustrating the relationships between operation current and line width in the first embodiment and a prior art.

FIG. 6 schematically illustrates relationships between operation current and line width of the first embodiment and a prior art device. A degree of difference between the first embodiment and the prior art device increases when the method (1) is used during the modulation. As is known from FIG. 6, a range of operation current is wide while the line width varies within a narrow range at a low level in this embodiment. In contrast, a range of operation current is narrow and the line width varies in a relatively wide range at a high level in the prior art device.

Figure 7:
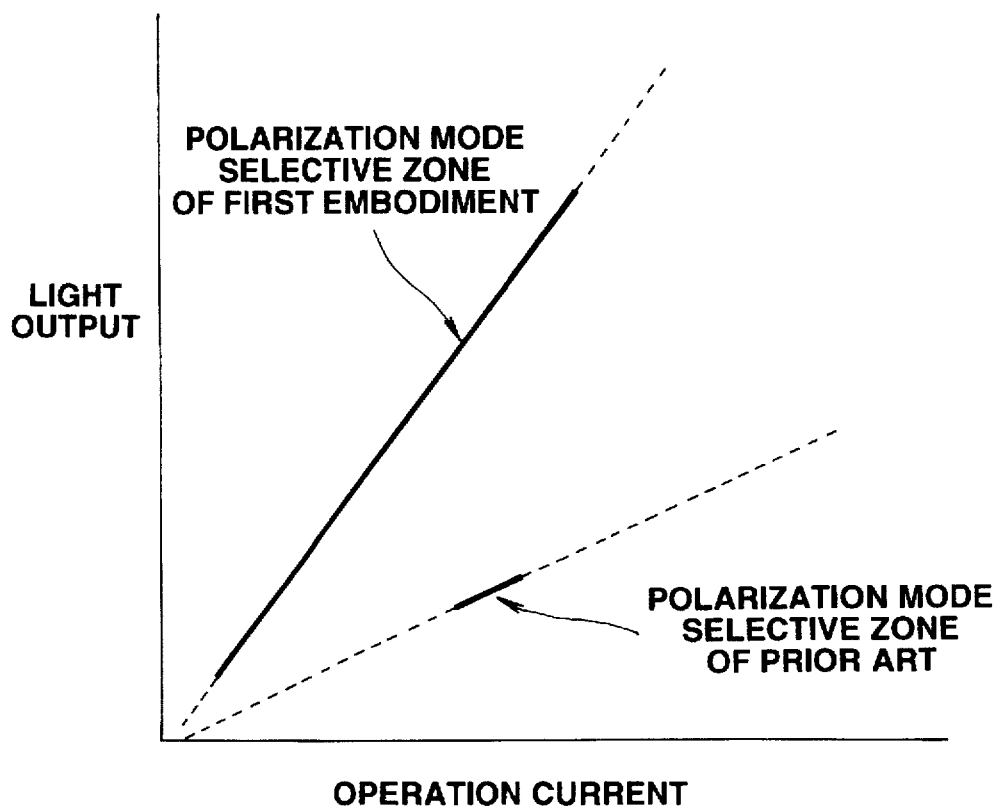
FIG. 7 is a graph schematically illustrating a difference between the first embodiment and a prior art in a range in which the oscillation polarization mode switching is possible, by using the relationship between operation current and light output.

FIG. 7 schematically illustrates relationships between operation current and light output intensity of the first embodiment and a prior art device to show a difference in polarization mode selective zones therebetween. As is known from FIG. 7, a range of operation current is wide and the light output intensity can be varied over a wide range in this embodiment. In contrast, a range of operation current is narrow and the light output intensity can be changed only in a narrow range in the prior art device.

In this embodiment, the polarization dependencies of both the gain region and the lossy region can be utilized and controlled, and hence, relations (1), (2) and (3) can be satisfied without any difficulty. To perform the polarization modulation, an electric signal is superposed on a bias current or voltage in at least one of the gain regions and the lossy region and the oscillation polarization mode is switched as discussed above.

Regarding QCSE, it is known that the polarization dependency of wavelength dispersion can be speedily changed by QCSE. When a waveguide layer having QCSE is used in the lossy region, the total loss spectrum can have the polarization dependency and relations (1), (2) and (3) can be satisfied simultaneously. The loss can be speedily modulated by QCSE and one of the polarization modes can be selected. Further, gain or phase can be varied by changing the carrier density, and the polarization mode can be speedily switched between two polarization modes.

According this embodiment, the modulation efficiency is high when the light output intensity is the same, compared with a prior art device. Further, a range of light output intensity, in which oscillation polarization mode can be switched, is wide, as discussed above.

Second Embodiment

Figure 8:
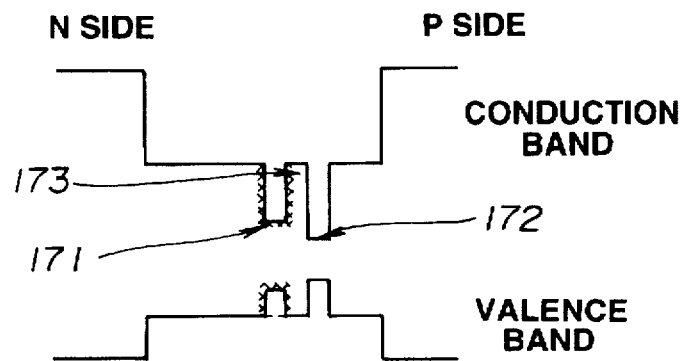
FIG. 8 is a diagram of the energy band structure of an active layer and layers adjacent thereto formed in a second embodiment and other embodiments of the present invention.
Figure 9:
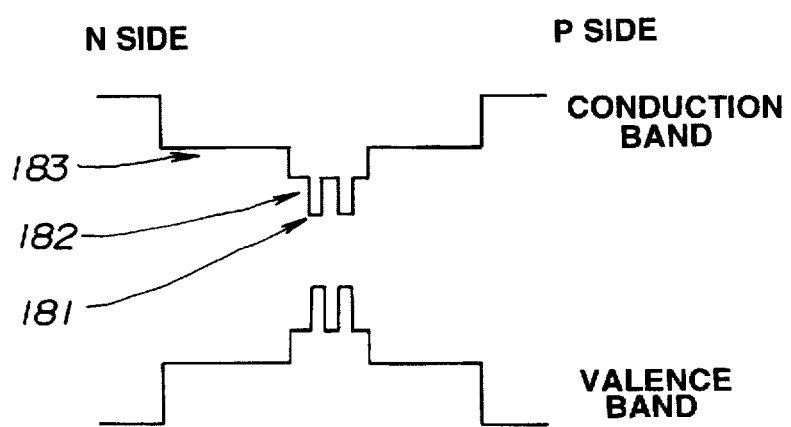
FIG. 9 is a diagram of the energy band structure of a lossy layer and layers adjacent thereto formed in the second embodiment and other embodiments of the present invention.

A second embodiment of the present invention will be described with reference to FIGS. 8 through 10. In the second embodiment, structures of the gain regions and the lossy region of the first embodiment are individually optimized to achieve a higher performance. The structure of the second embodiment is the same as the first embodiment, except for those of the active layer 104a and the lossy layer 104b. FIG. 8 illustrates the band structure of an active layer of the second embodiment. FIG. 9 illustrates the band structure of a lossy layer of the second embodiment.

The active layer of the second embodiment consists of an asymmetric strained dual quantum well structure including an InGaAs well layer 171, an InGaAsP well layer 172 and an InGaAsP barrier layer 173. A tensile strain of 1.0% is introduced only into the InGaAs well layer 171 having a thickness of 10 nm, and no strain is introduced into either the InGaAsP well layer 172 (thickness: 10 nm, and energy gap wavelength: 1.65 μm) or the InGaAsP barrier layer 173 (thickness: 10 nm, and energy gap wavelength: 1.3 μm). The lossy layer of the second embodiment consists of two InGaAs well layers 181 (thickness: 10 nm, and tensile strain: 1.7%), InGaAsP barrier layers 182 (thickness: 10 nm, and composition wavelength: 1.2 μm) and a pair of InGaAsP SCH layers 183 (thickness: 100 nm, and composition wavelength: 1.2 μm).

The asymmetric quantum well structure has a larger freedom of variation in its bandgap than an ordinary quantum well structure, and further a strained asymmetric quantum well structure has a still larger freedom of variation in its bandgap than the asymmetric quantum well structure. When strain is asymmetrically introduced into the asymmetric quantum well structure, bandgaps can be selectively or independently varied for different polarization modes (TE and TM modes). This means that gains generated in a common active layer by a common injection current density can be respectively set to threshold gains for different polarization modes (TE and TM modes). As a result, when the threshold carrier density or injection curent is set at a polarization modulation bias current point and a signal current is superimposed on the threshold injection current, for example, the oscillation polarization of output light can be switched between two polarization modes. The amplitude of the signal current superimposed on the bias current is small, so that the density of carriers in a laser cavity or resonator scarcely fluctuates. Therefore, the intensity of total output light scarcely varies during the polarization switching operation. Thus, chirping is substantially reduced.

Figure 10:
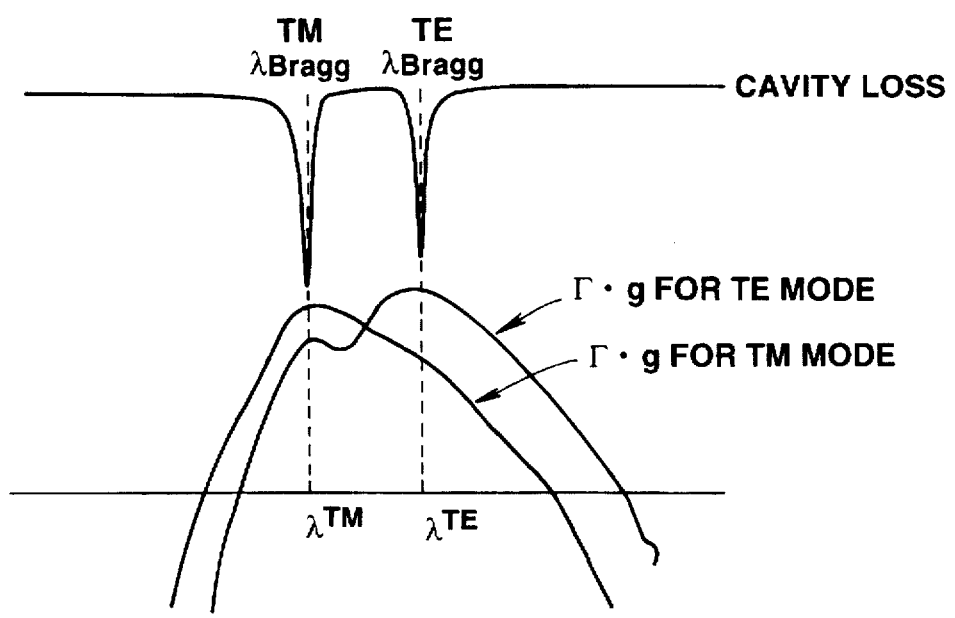
FIG. 10 is a graph illustrating the relationship between gains (more accurately $\Gamma \cdot g$) for TE and TM modes and cavity losses ($\Gamma \cdot \alpha_{in} + \alpha_M + \alpha_{SC}$) at the time when carriers are injected into a gain region or gain regions of the second embodiment and other embodiments and a voltage is applied to a lossy region of the second embodiment and other embodiments.

FIG. 10 illustrates the relationship between gains (accurately $\Gamma \cdot g$) and cavity losses ($\Gamma \cdot \alpha_{in} + \alpha_M + \alpha_{SC}$) for the TE mode and the TM mode at the time when carriers are injected into the first gain region and the second gain region and a voltage applied to the lossy region is controlled. The operation principle of this embodiment is substantially the same as the first embodiment. The second embodiment differs from the first embodiment in that the structures of the gain regions and the lossy region are individually optimized as described above. As a result, the operation current can be further lowered, the modulation efficiency can be further enhanced, the line width can be further narrowed and the polarization mode selective zone can be further widened.

Third Embodiment

Figure 11:
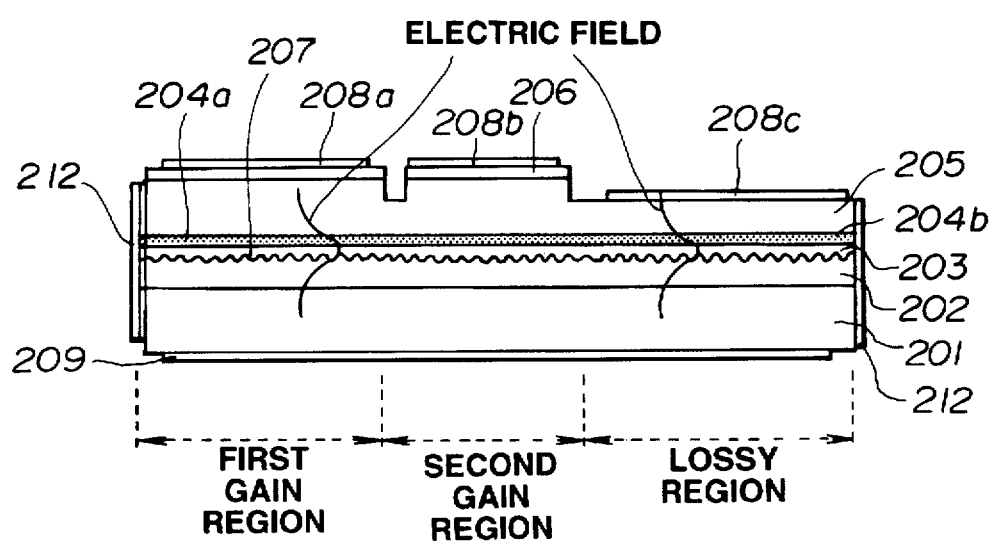
FIG. 11 is a longitudinal cross-sectional view taken along a cavity direction showing the structure of a third embodiment of an oscillation polarization selective semiconductor laser according to the present invention.
Figure 12:
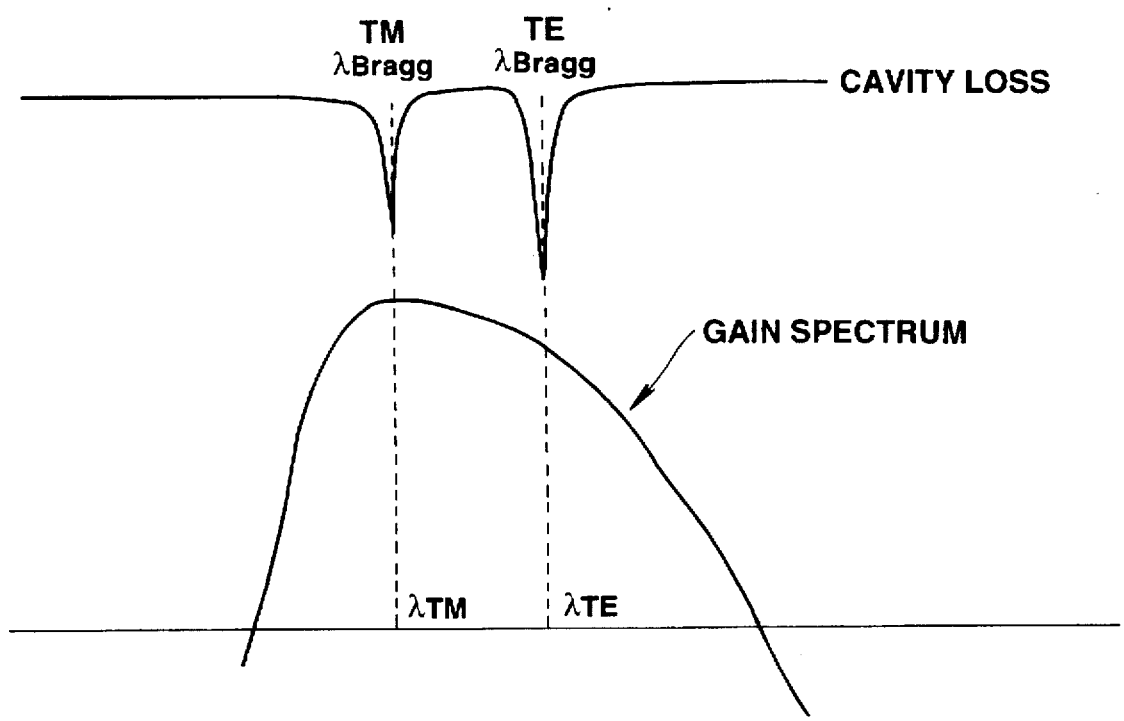
FIG. 12 is a graph illustrating the relationship between gains (more accurately $\Gamma \cdot g$) for TE and TM modes and cavity losses ($\Gamma \cdot \alpha_{in} + \alpha_M + \alpha_{SC}$) at the time when carriers are independently injected into first and second gain regions of the third embodiment and a reverse voltage is applied to a lossy region of the third embodiment.

A third embodiment of the present invention will be described with reference to FIGS. 11 and 12. FIG. 11 illustrates a cross-sectional view of the third embodiment taken along a cavity direction. In FIG. 11, a device of the third embodiment is divided into three portions along the cavity direction, i.e., a first gain region, a second gain region and a lossy region. Those regions are electrically independent from each other, but optically coupled to each other through a common optical waveguide layer 203, similar to the first embodiment.

As shown in FIG. 11, the semiconductor laser of this embodiment includes an n-type InP substrate 201, an n-type InP cladding layer 202, the n-type InGaAsP lower optical waveguide layer 203, an undoped InGaAsP active layer 204a, an undoped InGaAsP lossy layer 204b, a p-type InP cladding layer 205, a p-type InGaAsP contact layer 206, positive or p-side electrodes 208a, 208b and 208c, and a negative or n-side electrode 209. A grating 207 is formed at a boundary between the n-type cladding layer 202 and the n-type optical waveguide layer 203, and it has a phase shift section. Antireflection (AR) coatings 212 are provided on opposite end facets.

The pitch of the grating 207 is set such that its Bragg wavelength for the TM mode is positioned at a gain peak wavelength. In this embodiment, structures of the active layer 204a and the lossy layer 204b are the same (i.e., a bulk structure). The third embodiment is further different from the first embodiment in that the p-type cladding layer 205 in the lossy region is so thin that an electric field distribution of propagated light in the lossy region can extend to the electrode or loaded metal 208c. As a result, the lossy region only acts for propagated light wave in the TM mode.

The operation principle of this embodiment will be described. FIG. 12 illustrates the relationship between gains (more accurately $\Gamma \cdot g$) and cavity losses ($\Gamma \cdot \alpha_{in} + \alpha_M + \alpha_{SC}$) for the TE mode and the TM mode at the time when carriers (about $10^{18}$ cm$^{-3}$) are uniformly injected into the first gain region and the second gain region to adjust the phase of DFB mode and a reverse bias voltage (about −5V) is applied to the lossy region. The abscissa indicates wavelength. Since the bulk active layer 204a is used, gain spectra for the TE mode and the TM mode are nearly the same. A peak value of the cavity loss spectrum for the TM mode is larger than that for the TE mode because of the loaded metal 208c which has a suppressing effect for the TM mode. Therefore, relation (3) can be satisfied by adjusting the grating pitch such that gain at the Bragg wavelength for the TM mode is larger than that for the TE mode. The cavity loss profile can be controlled due to Franz-Keldysh (F-K) effect by applying a reverse voltage across the lossy region.

The third embodiment features a polarization selective semiconductor laser that can be obtained by a simple fabrication method since the active layer and the lossy layer have the bulk structure. The operation principle of this embodiment is substantially the same as that of the first embodiment.

Thus, in the third embodiment, loss can be imparted only to the TM mode by the loaded metal film on the waveguide surface of the lossy region. The oscillation polarization mode can be modulated, for example, by controlling the gain profile in the gain region.

Further, it is known that the F-K effect can speedily change the wavelength dispersion, and the total loss spectrum can have the polarization dependency by using a waveguide layer having the F-K effect in the lossy region. The oscillation polarization mode can also be modulated, for example, by controlling the loss profile in the lossy region.

Fourth Embodiment

A fourth embodiment of the present invention will be described with reference to FIGS. 3 through 5, 13 and 14. The fourth embodiment is directed to an optical semiconductor device having a gain region, a lossy region, a phase control region and a wavelength control region which are respectively arranged along a cavity or light propagation direction. The respective regions are electrically independent from each other, but optically coupled to each other through a common optical waveguide layer 303.

Figure 13:
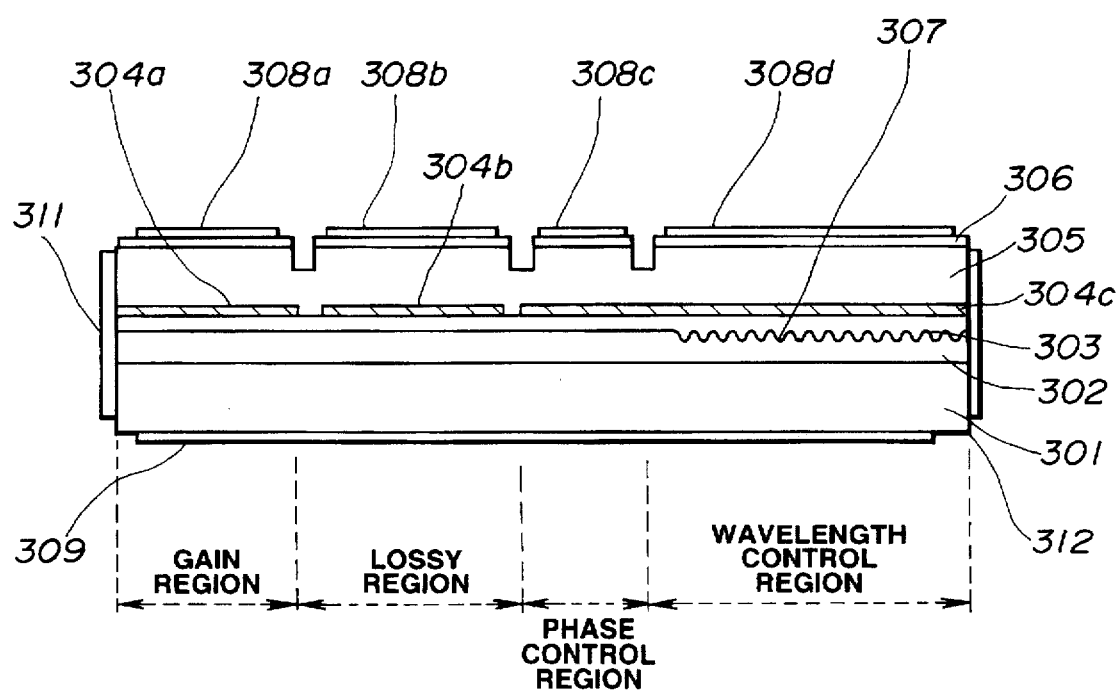
FIG. 13 is a longitudinal cross-sectional view taken along a cavity direction showing the structure of a fourth embodiment of an optical semiconductor device according to the present invention.

As shown in FIG. 13, the semiconductor device of this embodiment includes an n-type InP substrate 301, an n-type InP cladding layer 302, the n-type InGaAsP optical waveguide layer 303, an undoped InGaAsP active layer 304a, an undoped InGaAsP lossy layer 304b, an InGaAsP tuning layer 304c, a p-type InP upper cladding layer 305, a p-type InGaAsP contact or cap layer 306, positive or p-side electrodes 308a, 308b, 308c and 308d, and a negative or n-side electrode 309. A grating 307 is formed at a boundary between the n-type lower cladding layer 302 and the n-type optical waveguide layer 303 in the wavelength control region. Thus, the device of this embodiment is built as a distributed Bragg reflector type.

Further, reference numeral 311 is a λ/2 coating provided on one end facet on the gain region side. A reference numeral 312 is an antireflection coating provided on the other end facet on the wavelength control region side. The pitch of the grating 307 is set such that its Bragg wavelength for the TM mode is positioned at a gain peak wavelength. In this embodiment, the active layer 304a in the gain region has the same structure as the lossy layer 304b in the lossy region, similar to the first embodiment.

Figure 14:
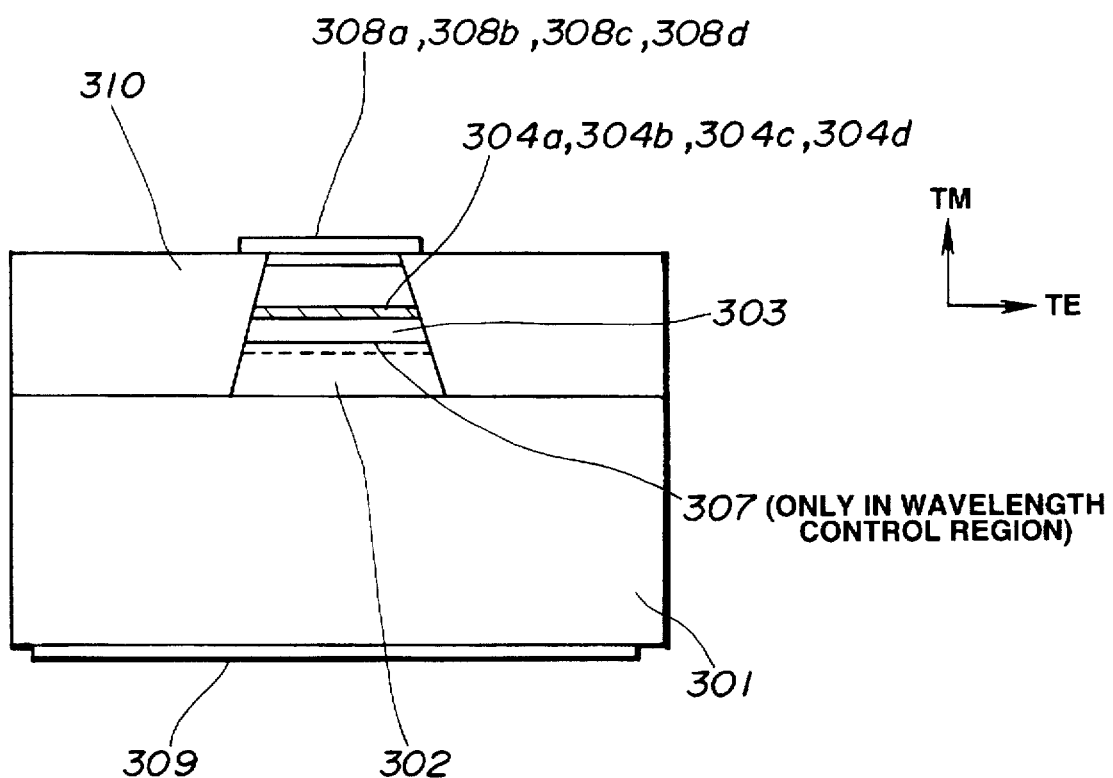
FIG. 14 is a transverse or lateral cross-sectional view taken along a lateral direction showing the structure of the fourth embodiment.

As shown in FIG. 14, which is a cross-sectional view taken along a lateral direction, reference numeral 310 designates a high-resistance InP burying layer.

Each of the active layer 304a and the lossy layer 304b (or an absorptive layer) consists of five InGaAs well layers (thickness: 10 nm and tensile strain: 1.0%), InGaAsP barrier layers (thickness: 10 nm and composition wavelength: 1.1 µm) and a pair of InGaAsP SCH layers (thickness: 100 nm and composition wavelength: 1.2 µm). Energy band gap structures of the active layer 304a and the lossy layer 304b are the same as that illustrated in FIG. 3.

The operation principle of this embodiment will be described. FIG. 4 also illustrates the relationship between gains (or more precisely, $\Gamma \cdot g$) and cavity losses ($\Gamma \cdot \alpha_{in} + \alpha_M + \alpha_{SC}$) for the TE mode and the TM mode at the time when carriers (about $10^{18}$ cm$^{-3}$) are injected into the gain region through the electrode 308a and the electrode 309 of this embodiment. FIG. 5 also illustrates such relationship at the time when carriers are injected into the gain region and a reverse voltage (e.g., about −5 V) is applied across the electrode 308b and the electrode 309 in the lossy region to optimize the cavity spectra. The peak value of a cavity loss spectrum for the TM mode is smaller than that for the TE mode due to QCSE in the lossy layer 304b. Thus, relation (3) can be readily satisfied by controlling the cavity loss spectrum as well as the gain spectrum. Those are substantially the same as the first embodiment.

While relation (3) is maintained, a current is injected through the electrode 308d and the electrode 309 to change the amount of carriers injected into the wavelength control (tuning) region and change the effective refractive index $n_{eff}$ thereof. Thus, the oscillation wavelength can be scanned, as is known from relation (2). At this time, the phase (φ in relation (2)) may shift. Therefore, a current is injected through the electrode 308c and the electrode 309 in the phase control region to control the phase by carriers injected into the tuning layer 304c therein.

After the current injected into the gain region and the voltage applied to the lossy region are adjusted so that relation (3) is satisfied in a stationary state, oscillation polarization modulation can be performed by one of the following methods, similar to the first embodiment:

(1) A signal is applied to the lossy region as a voltage.

(2) A signal is superposed on a bias current injected into the gain region.

A case where the device of this embodiment operates as a wavelength tunable filter will be described. FIGS. 4 and 5 will be used for the description. In this case, $\lambda_{TE}$ and $\lambda_{TM}$ are respectively considered as TE and TM components of light incident on the tunable filter.

(1) Initially, the Bragg wavelength is positioned near a gain peak wavelength by using the above-discussed wavelength tuning mechanism (a stand-by state).

(2) Then, light at a plurality of wavelengths including light at a desired wavelength (its polarization direction fluctuates) is caused to be incident on the end facet of the device.

(3) Desired light or light considered to be desired is identified out of the light at a plurality of wavelengths, by using the above-described wavelength tuning mechanism or other wavelength selecting means.

The light incident on the tunable filter is generally a circularly-polarized light that changes slowly with time. As a result, the incident light has TE and TM components in the tunable filter. In FIGS. 4 and 5, the TE component ($\lambda_{TE}$) and the TM component ($\lambda_{TM}$) at the time when light at a predetermined wavelength is selected, are indicated.

(4) Carriers injected into the gain region and a voltage applied to the lossy region are controlled to strengthen the component in one polarization direction.

(5) As the polarization direction varies with time, the gain region and the lossy region are controlled while an output of the tunable filter is monitored by a photodetector or the like arranged at the back of the filter.

Thus, even if the polarization slowly varies, light in the TE or TM mode can always be selected with a maximum sensitivity in this embodiment. This improvement is important because, when wavelength selection is performed using a single semiconductor laser type optical filter, a polarization analyzer or the like is indispensable to stabilize a polarized wave incident on the optical filter.

The structure of the tunable optical filter is approximately the same as the semiconductor laser of this embodiment, with the exception that the λ/2 coating 311 is replaced by an antireflection coating. In this case, the structure of a receiver can be the same as that of a transmitter, so that this example is advantageously suitable for integration. In addition, it is also advantageous in cost. In the case of an optical filter, however, to narrow a line width is less important than to reduce the polarization dependency. The filter may be modified for that purpose. For example, in the case of an ordinary optical filter, the larger the coupling parameter (κ(coupling coefficient)×L(coupling length)) of a grating is, the better it becomes. Hence, the modification of the filter may be to change the cavity length, to change a ratio between the gain region and the lossy region, to change the depth of a grating, to change the electric field distribution, or the like.

Further, two optical filters may be arranged in parallel, and a light signal may be divided into two and input into those filters. One filter receives a light component in the TE mode and the other filter receives a light component in the TM mode. Thus, polarization diversity can be readily attained.

The first to third embodiments can also be used as an optical filter in a manner similar to the above-discussed manner.

Furthermore, the electrode 308c in the wavelength control region may be omitted to form a non-tunable DBR type optical semiconductor device. The lossy region of the loaded metal in the third embodiment can be applied to the lossy region of the fourth embodiment.

Fifth Embodiment

A fifth embodiment of the present invention will be described with reference to FIGS. 8 through 10. In the fifth embodiment, structures of the gain region and the lossy region of the fourth embodiment are individually optimized to achieve a higher performance. The structure of the fifth embodiment is the same as the fourth embodiment, except for those of the active layer 304a and the lossy layer 304b. FIG. 8 also illustrates the band structure of the active layer of the fifth embodiment. FIG. 9 also illustrates the band structure of the lossy layer of the fifth embodiment.

The active layer of the fifth embodiment consists of an asymmetric strained dual quantum well structure including an InGaAs well layer 171, an InGaAsP well layer 172 and an InGaAsP barrier layer 173. A tensile strain of 1.0% is introduced only into the InGaAs well layer 171 having a thickness of 10 nm, and no strain is introduced into either the InGaAsP well layer 172 (thickness: 10 nm, and energy gap wavelength: 1.65 μm) or the InGaAsP barrier layer 173 (thickness: 10 nm, and energy gap wavelength: 1.3 μm). The lossy layer of the fifth embodiment consists of two InGaAs well layers 181 (thickness: 10 nm, and tensile strain: 1.7%), InGaAsP barrier layers 182 (thickness: 10 nm, and composition wavelength: 1.2 μm) and a pair of InGaAsP SCH layers 183 (thickness: 100 nm, and composition wavelength: 1.2 μm). Those changes are the same as those in the second embodiment.

FIG. 10 also illustrates the relationship between gains and cavity losses for the TE mode and the TM mode at the time when carriers are injected into the gain region and a voltage applied to the lossy region is controlled. The operation principle of this embodiment is substantially the same as the fourth embodiment. The fifth embodiment differs from the fourth embodiment in that the operation current can be further lowered, the modulation efficiency can be further enhanced (the polarization modulation can be performed by a still smaller change in a current or a voltage), the line width can be further narrowed and the polarization mode selective zone can be further widened (prior to the polarization modulation, a current injected into the gain region and a voltage applied to the lossy region need to be adjusted, and those adjustment range can be widened).

As regards tuning characteristics, the fifth embodiment is the same as the fourth embodiment. The operation of a tunable optical filter is also the same as the fourth embodiment.

Sixth Embodiment

Figure 15:
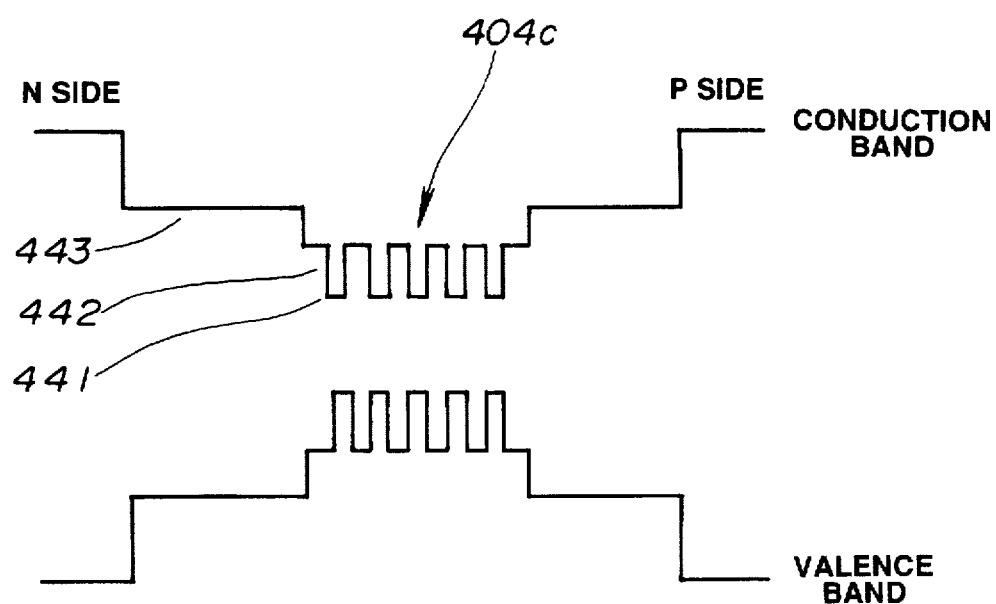
FIG. 15 is a diagram of the energy band structure of a tuning layer and layers adjacent thereto formed in a sixth embodiment of the present invention.

A sixth embodiment of the present invention will be described with reference to FIG. 15. In the sixth embodiment, a tunable range is widened. The structure of the sixth embodiment is the same as the fourth embodiment, except for the structure of a tuning layer 404c which includes a multiple quantum well structure. FIG. 15 illustrates the band structure of the tuning layer 404c of the sixth embodiment.

The tuning layer 404c of the sixth embodiment consists of five InGaAs well layers 441 (thickness: 10 nm and tensile strain: 1.0%), InGaAsP barrier layers 442 (thickness: 10 nm and composition wavelength: 1.2 μm) and a pair of InGaAsP SCH layers 443 (thickness: 100 nm and composition wavelength: 1.2 μm). Since a tensile strain is introduced, the electron density in the conduction band is increased and a change in the effective refractive index of the tuning layer 404c is enlarged. As a result, the tunable range becomes two times as large as that in the fourth embodiment. Also with respect to a tunable optical filter, the tunable range becomes about two times that of the fourth embodiment.

Seventh Embodiment

Figure 16:
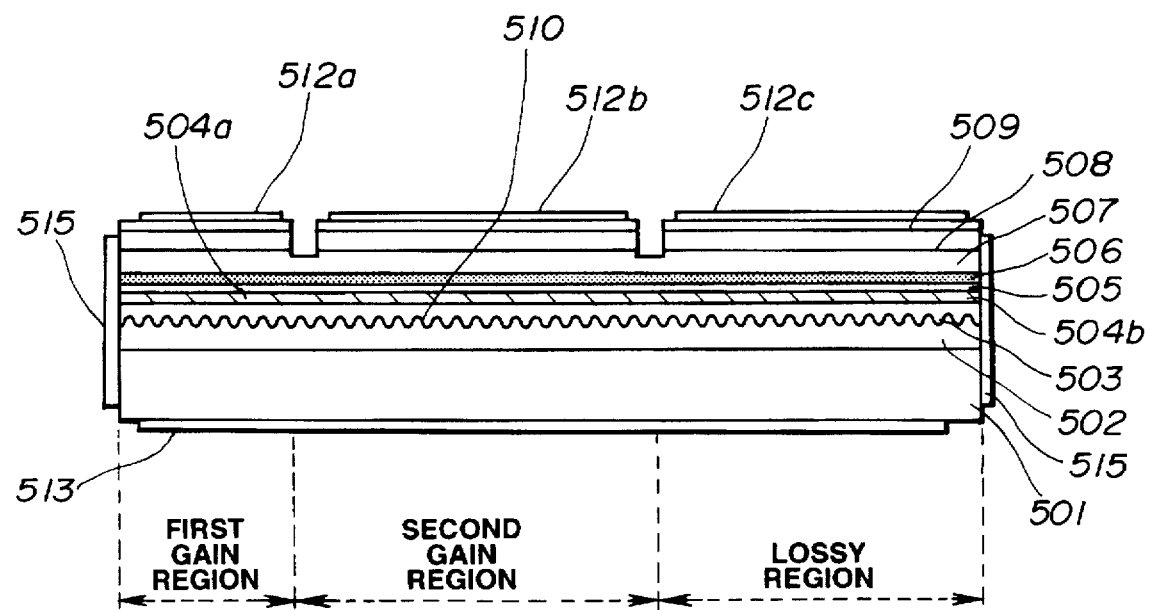
FIG. 16 is a longitudinal cross-sectional view taken along a cavity direction showing the structure of a seventh embodiment of an optical semiconductor device according to the present invention.
Figure 17:
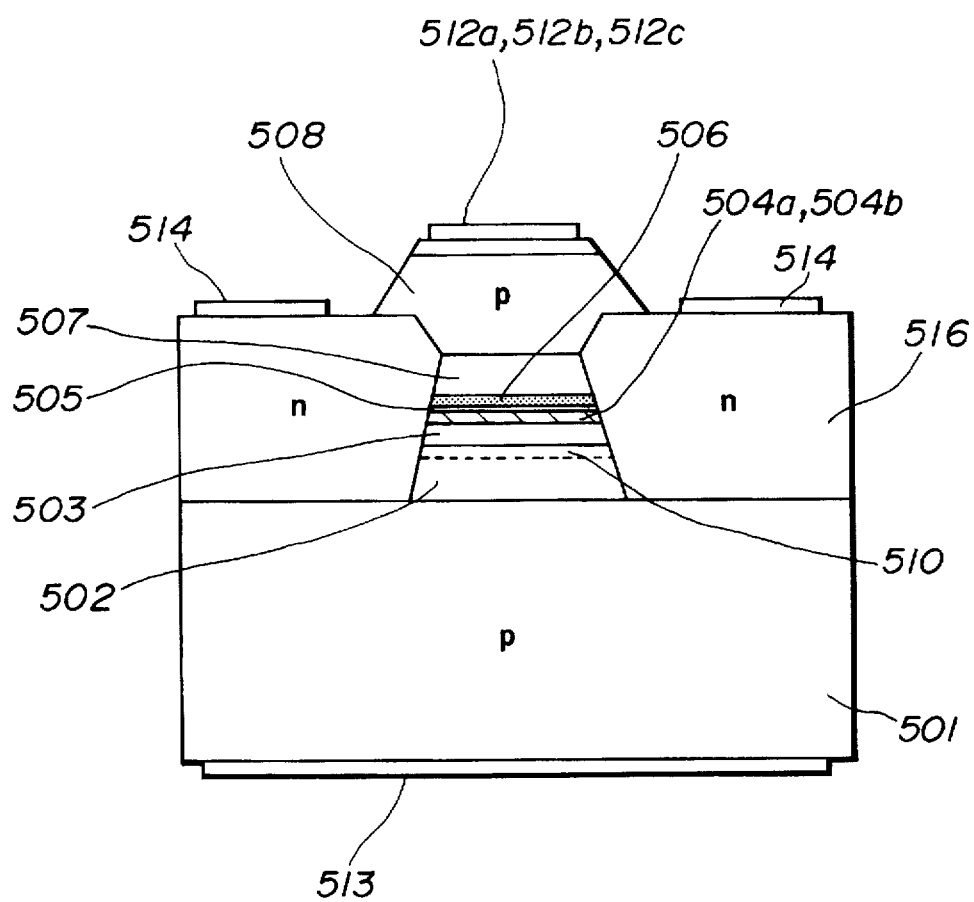
FIG. 17 is a transverse or lateral cross-sectional view taken along a lateral direction showing the structure of the seventh embodiment.

A seventh embodiment of the present invention will be described with reference to FIGS. 16 and 17. The seventh embodiment is directed to an optical semiconductor device of a distributed feedback (DFB) type having a first gain region, a second gain region and a lossy region which are respectively arranged along a cavity or light propagation direction as shown in FIG. 16. The respective regions are electrically independent from each other, but optically coupled to each other through a common optical waveguide layer 503 and a tuning layer 506.

As shown in FIG. 16, the semiconductor device of this embodiment includes a p-type InP substrate 501, an n-type InP cladding layer 502, the n-type InGaAsP optical waveguide layer 503, an undoped InGaAsP active layer 504a, an undoped InGaAsP lossy layer 504b, a p-type InP spacer layer 505, the InGaAsP tuning layer 506, a p-type InP cladding layer 507, a p-type burying layer 508, and a p-type InGaAsP contact layer 509. Further, as shown in FIG. 17 which is a cross-sectional view taken along a lateral direction, reference numeral 516 designates an n-type InP lateral contact layer. Positive or p-side electrodes 512a, 512b, 512c and 513, and a negative or n-side electrode 514 are also deposited. A grating 510 is formed at a boundary between the n-type lower cladding layer 502 and the n-type optical waveguide layer 503. The grating 510 has a phase shift section (or some sections). Antireflection (AR) coatings 515 are provided on both opposite end facets. The pitch of the grating 510 is set such that its Bragg wavelength for the TM mode is positioned at a gain peak wavelength. In this embodiment, the active layer 504a in the first and second gain regions has the same structure as that of the lossy layer 504b in the lossy region. FIG. 3 also illustrates band structures of those layers 504a and 504b.

The operation principle of this embodiment will be described. This is substantially the same as the operation of the fourth embodiment. FIG. 4 also illustrates the relationship between gains and cavity losses ($\Gamma \cdot \alpha_{in} + \alpha_M + \alpha_{SC}$) for the TE mode and the TM mode at the time when carriers (about $10^{18}$ cm$^{-3}$) are injected into the first and second gain regions through the electrode 513 and the electrode 514 of this embodiment. FIG. 5 also illustrates such relationship at the time when carriers are unevenly injected into the gain regions to optimize the gain spectra and a reverse voltage (e.g., about −5 V) is applied across the lossy region between the electrode 513 and the electrode 514. The peak value of the cavity loss spectrum for the TM mode is smaller than that for the TE mode due to the polarization dependency of cavity loss resulted from QCSE in the lossy region. Thus, relation (3) can be readily satisfied by controlling the cavity loss spectrum as well as the gain spectrum. Here, the phase adjustment is also conducted by uneven carrier injection into the first and second gain regions.

While relation (3) is maintained, a current is injected through the electrode 512a and/or 512b and/or 512c and the electrode 514 to change the amount of carriers injected into the first and/or second gain regions and/or the lossy region and change the refractive index $n_{eff}$ thereof. Thus, the oscillation wavelength can be scanned, as is seen from relation (2). At this time, the phase ($\phi$ in relation (2)) is also controlled.

After the current injected into the first and second gain regions and the voltage applied to the lossy region are adjusted so that relation (3) is satisfied in a stationary state, modulation can be performed by one of the following methods, similar to the fourth embodiment:

(1) A signal is applied to the lossy region as a voltage.

(2) A signal is superposed on a bias current or currents injected into the first gain region and/or the second gain region.

In respect of the case where the device of this embodiment is used as a tunable optical filter, the operation is also the same as described in the fourth embodiment.

The seventh embodiment can also be modified as described in the fifth embodiment and the sixth embodiment.

Eighth Embodiment

Figure 18:
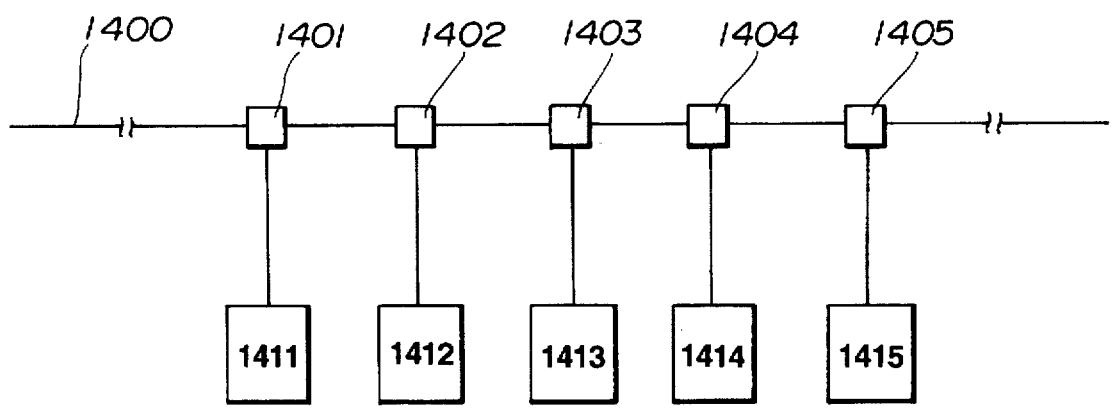
FIG. 18 is a block diagram of a bus-type optical communication network according to the present invention.
Figure 19:
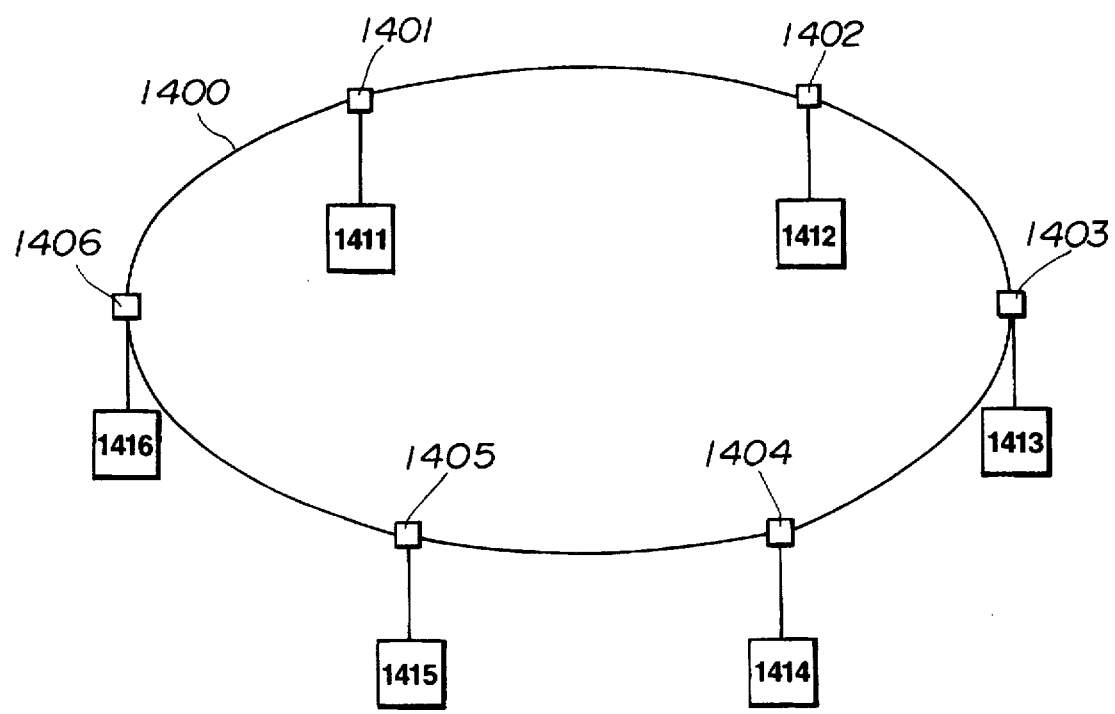
FIG. 19 is a block diagram of a loop or ring-type optical communication network according to the present invention.

An eighth embodiment will be described with reference to FIGS. 18 and 19. This embodiment is directed to an optical communication network using the above-discussed optical semiconductor devices as a light source and an optical filter, and a polarizer.

The polarizer is disposed in front of the light emission end of the laser device described in one of the first to seventh embodiments, which is used as a light source. Thereby, only a predetermined polarized light can be taken out, and an amplitude-modulated signal can be transmitted over a transmission line. Networks illustrated in FIGS. 18 and 19 are respectively bus-type and loop-type networks, and devices of the present invention are respectively arranged in optical nodes 1401–1406. In FIGS. 18 and 19, reference numeral 1400 is an optical bus line and reference numerals 1411–1416 are terminals.

On the other hand, an optical semiconductor filter of the present invention described above receives an incident light in a wavering polarization mode from the transmission line 1400, using the above-described wavelength tuning means. Although the polarization state of the incident light varies with time, light receiving can always be performed with a maximum efficiency by controlling the gain region and the lossy region in the optical filter.

When two optical filters are arranged in parallel, a light signal is divided into two and input into the respective filters, and one is received in the TE mode by one filter while the other is received in the TM mode by the other filter. Thus, the polarization diversity can be readily achieved.

In the semiconductor laser of the present invention, the line width is narrow and stable even during a high-speed modulation. The optical filter of the present invention, its pass band is narrow and its tunable range is wide. As semiconductor laser and optical semiconductor filter of the present invention have substantially the same structure as discussed above, integration of the node is readily achieved and its cost can be reduced.

Ninth Embodiment

In the eighth embodiment, if no polarizer is used, different polarized light waves can be transmitted simultaneously. As a result, a network can have multiple performances using devices of the present invention. In a wavelength or frequency division multiplexing system using a tunable laser and a tunable wavelength filter of the present invention, for example, since the tunable filter of the present invention can be sensitive to the polarization state, devices of the present invention can be used as a light source with a very simple structure for polarization diversity. In this case, light received on a receiver side is divided into two portions and the divided portions are received by respective tunable filters. The polarization sensitive characteristics of the two filters are set substantially perpendicular to each other and signals are received by the two filters. In this construction, the different polarized light waves simultaneously transmitted from a transmitter side can be stably demodulated by appropriately processing outputs of the two filters, even if polarization directions of light signals fluctuate on the receiver side.

In the above-discussed embodiments, a device for a 1.5 µm band is used, but materials of other wavelength bands and other series can be used in the present invention.

As described in the foregoing, according this invention, ranges of current, light output, operation temperature, oscillation wavelength, extinction ratio and the like, in which the oscillation polarization mode can be stably switched, are wide, as discussed above. Further, the degree of freedom in the device's design is high and the device's structure is relatively simple, so its fabrication yield is large. Moreover, operation current is small and the device's structure is relatively simple, so the device's life can be prolonged.

Further, according to the present invention, operation stability of a line width of a device of the present invention is excellent, so when a device is combined with a wavelength filter having a narrow pass band, high-density wavelength division multiplexing communication networks can be realized, for example.

Furthermore, according to the present invention, a tunable semiconductor laser with a reduced chirping can be achieved. A tunable optical filter, whose transmission characteristic is insensitive to the polarization mode and which can be used in combination with the light source described above, can also be attained. Structures of semiconductor laser and semiconductor filter can be substantially the same, so that high performance and reduced cost can be obtained by the integration of devices, for example.

Except as otherwise disclosed herein, the various components shown in outline or block form in the Figures are individually well known in the optical semiconductor device and optical communication arts, and their internal construction and operation are not critical either to making or using this invention, or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. An optical semiconductor device comprising:
   at least one gain region, said gain region including a light waveguide with an active layer which allows the two different polarization modes;
   at least one lossy region, said lossy region including a light waveguide which allows the two different polarization modes;
   first control means for controlling said gain region to control a gain spectrum of said device; and
   second control means for controlling said lossy region to control a cavity loss spectrum of said device such that a polarization dependency with respect to the two different polarization modes is imparted to the cavity loss spectrum,
   wherein said gain region and said lossy region are electrically independent from each other and optically coupled to each other through a common optical waveguide layer.

2. An optical semiconductor device comprising:
   at least one gain region, said gain region including a light waveguide with an active layer which allows the two different polarization modes;
   at least one lossy region, said lossy region including a light waveguide which allows the two different polarization modes;
   first control means for controlling said gain region to control a gain spectrum of said device; and
   second control means for controlling said lossy region to control a cavity loss spectrum of said device such that a polarization dependency with respect to the two different polarization modes is imparted to the cavity loss spectrum,
   at least part of said light waveguide in said lossy region comprising a super-lattice structure which has quantum confinement Stark effect (QCSE).

3. An optical semiconductor device comprising:
   at least one gain region, said gain region including a light waveguide with an active layer which allows the two different polarization modes;
   at least one lossy region, said lossy region including a light waveguide which allows the two different polarization modes;
   first control means for controlling said gain region to control a gain spectrum of said device;
   second control means for controlling said lossy region to control a cavity loss spectrum of said device such that a polarization dependency with respect to the two different polarization modes is imparted to the cavity loss spectrum; and
   a phase control region.

4. An optical semiconductor device according to claims 1, 2 or 3, said light waveguide in said lossy region comprising a lossy layer, and said active layer and said lossy layer comprising a common strained quantum well layer.

5. An optical semiconductor device according to claims 1, 2 or 3, said first control means controlling a density of carriers injected into said active layer in said gain region.

6. An optical semiconductor device according to claims 1, 2 or 3, said second control means controlling a voltage applied across said lossy region.

7. An optical semiconductor device according to claims 1, 2 or 3, at least part of said light waveguide in said lossy region comprising a structure which has Franz-Keldysh effect.

8. An optical semiconductor device according to claims 1, 2 or 3, at least part of said lossy region comprising a metal loaded thereon.

9. An optical semiconductor device according to claim 8, said first control means controlling a density of carriers injected into said active layer in said gain region.

10. An optical semiconductor device according to claims 1, 2 or 3, said gain region being designed such that a polarization dependency is imparted to gains for the two different polarization modes.

11. An optical semiconductor device according to claim 10, said active layer of said gain region comprising an asymmetric multiple quantum well structure which includes a plurality of sets of quantum wells and barriers, and the structure of one set of said well and said barrier being different from the structure of the other set in at least one of layer thicknesses, compositions and strains of said well and said barrier.

12. An optical semiconductor device comprising:
    at least one gain region, said gain region including a light waveguide with an active layer which allows the two different polarization modes;
    at least one lossy region, said lossy region including a light waveguide which allows the two different polarization modes;
    first control means for controlling said gain region to control a gain spectrum of said device;
    second control means for controlling said lossy region to control a cavity loss spectrum of said device such that a polarization dependency with respect to the two different polarization modes is imparted to the cavity loss spectrum; and
    a distributed feedback reflector formed along at least part of said light waveguide to form a distributed feedback reflector type device, said distributed reflector comprising a diffraction grating with a phase shift section.

13. An optical semiconductor device comprising:
    at least one gain region, said gain region including a light waveguide with an active layer which allows the two different polarization modes;
    at least one lossy region, said lossy region including a light waveguide which allows the two different polarization modes;
    first control means for controlling said gain region to control a gain spectrum of said device;
    second control means for controlling said lossy region to control a cavity loss spectrum of said device such that a polarization dependency with respect to the two different polarization modes is imparted to the cavity loss spectrum; and
    a distributed Bragg reflector region serially arranged with said gain region and said lossy region along a cavity direction, said distributed reflector comprising a diffraction grating with a phase shift section.

14. An optical semiconductor device according to claim 12, the two different polarization modes being respectively transverse electric (TE) and magnetic (TM) modes, and a pitch of said distributed reflector being set such that Bragg wavelength for the TM mode is positioned at a gain peak wavelength of the gain spectrum.

15. An optical semiconductor device according to claim 13, the two different polarization modes being respectively transverse electric (TE) and magnetic (TM) modes, and a pitch of said distributed reflector being set such that Bragg wavelength for the TM mode is positioned at a gain peak wavelength of the gain spectrum.

16. An optical semiconductor device according to claim 12, further comprising antireflection coatings provided on opposite end facets of said semiconductor device.

17. An optical semiconductor device according to claim 13, further comprising an antireflection coating provided on an end facet of said distributed Bragg reflector region.

18. An optical semiconductor device according to claims 1, 2 or 3, further comprising tuning means for tuning a wavelength independently from said first control means and said second control means.

19. An optical semiconductor device according to claim 18, said tuning means comprising a wavelength control region arranged serially with said gain region and said lossy region, said wavelength control region including a tuning layer and a distributed Bragg reflector.

20. An optical semiconductor device according to claim 18, said tuning means comprising a wavelength tuning layer formed in parallel with said gain region and said lossy region, and further comprising a distributed feedback reflector formed along a cavity direction.

21. An optical semiconductor device according to claim 19, said wavelength tuning layer comprising a multiple quantum well structure.

22. An optical semiconductor device according to claim 20, said wavelength tuning layer comprising a multiple quantum well structure.

23. An optical semiconductor device according to claims 1, 2 or 3, wherein said device is constructed as a semiconductor laser for switching an oscillation polarization mode between two different polarization modes.

24. An optical semiconductor device according to claims 1, 2 or 3, wherein said device is constructed as an optical semiconductor filter.

25. A light source apparatus comprising:
an oscillation polarization selective semiconductor device for switching an oscillation polarization mode between two different polarization modes, said semiconductor device including:
at least one gain region, said gain region including a light waveguide with an active layer which allows the two different polarization modes;
at least one lossy region, said lossy region including a light waveguide which allows the two different polarization modes;
first control means for controlling said gain region to control a gain spectrum of said device; and
second control means for controlling said lossy region to control a cavity loss spectrum of said device such that a polarization dependency with respect to the two different polarization modes is imparted to the cavity loss spectrum; and
a polarization mode selector disposed in front of a light emission end surface of said semiconductor device for selecting only a signal having a predetermined polarization mode.

26. A light source apparatus according to claim 25, wherein a distributed feedback reflector is formed along at least part of said light waveguide to form a distributed feedback reflector type device.

27. A light source apparatus according to claim 25, further comprising a distributed Bragg reflector region serially arranged with said gain region and said lossy region along a cavity direction.

28. A light source apparatus according to claim 25, wherein said gain region and said lossy region are electrically independent from each other and optically coupled to each other through a common optical waveguide layer.

29. A light source apparatus according to claim 25, at least part of said light waveguide in said lossy region comprising a super-lattice structure which has quantum confinement Stark effect (QCSE).

30. A light source apparatus according to claim 25, said light waveguide in said lossy region comprising a lossy layer, and said active layer and said lossy layer comprising a common strained quantum well layer.

31. A light source apparatus according to claim 25, said first control means controlling a density of carriers injected into said active layer in said gain region.

32. A light source apparatus according to claim 25, said second control means controlling a voltage applied across said lossy region.

33. A light source apparatus according to claim 25, at least part of said light waveguide in said lossy region comprising a structure which has Franz-Keldysh effect.

34. A light source apparatus according to claim 25, at least part of said lossy region comprising a metal loaded thereon.

35. A light source apparatus according to claim 34, said first control means controlling a density of carriers injected into said active layer in said gain region.

36. A light source apparatus according to claim 25, said gain region being designed such that a polarization dependency is imparted to gains for the two different polarization modes.

37. A light source apparatus according to claim 36, said active layer of said gain region comprising an asymmetric multiple quantum well structure which includes a plurality of sets of quantum wells and barriers, and the structure of one set of said well and said barrier being different from the structure of the other set in at least one of layer thicknesses, compositions and strains of said well and said barrier.

38. A light source apparatus according to claim 26, the two different polarization modes being respectively transverse electric (TE) and magnetic (TM) modes, and a pitch of said distributed reflector being set such that Bragg wavelength for the TM mode is positioned at a gain peak wavelength of the gain spectrum.

39. A light source apparatus according to claim 27, the two different polarization modes being respectively transverse electric (TE) and magnetic (TM) modes, and a pitch of said distributed reflector being set such that Bragg wavelength for the TM mode is positioned at a gain peak wavelength of the gain spectrum.

40. A light source apparatus according to claim 26, said distributed reflector comprising a diffraction grating with a phase shift section.

41. A light source apparatus according to claim 27, said distributed reflector comprising a diffraction grating with a phase shift section.

42. A light source apparatus according to claim 26, further comprising antireflection coatings provided on opposite end facets of said semiconductor device.

43. A light source apparatus according to claim 27, further comprising an antireflection coating provided on an end facet of said distributed Bragg reflector region.

44. A light source apparatus according to claim 25, further comprising tuning means for tuning a wavelength independently from said first control means and said second control means.

45. A light source apparatus according to claim 44, said tuning means comprising a wavelength control region arranged serially with said gain region and said lossy region, said wavelength control region including a tuning layer and a distributed Bragg reflector.

46. A light source apparatus according to claim 44, said tuning means comprising a wavelength tuning layer formed in parallel with said gain region and said lossy region, and further comprising a distributed feedback reflector formed along a cavity direction.

47. A light source apparatus according to claim 45, said wavelength tuning layer comprising a multiple quantum well structure.

48. A light source apparatus according to claim 46, said wavelength tuning layer comprising a multiple quantum well structure.

49. A light source apparatus according to claim 25, further comprising a phase control region.

50. A optical communication system for transmitting a signal from a transmitter side to a receiver side over a transmission line, said communication system comprising:
    an oscillation polarization selective semiconductor device for switching an oscillation polarization mode between two different polarization modes, said semiconductor device including:
        at least one gain region, said gain region including a light waveguide with an active layer which allows the two different polarization modes;
        at least one lossy region, said lossy region including a light waveguide which allows the two different polarization modes;
        first control means for controlling said gain region to control a gain spectrum of said device; and
        second control means for controlling said lossy region to control a cavity loss spectrum of said device such that a polarization dependency with respect to the two different polarization modes is imparted to the cavity loss spectrum; and
    a polarization mode selector disposed in front of a light emission end surface of said semiconductor device for selecting only a signal having a predetermined polarization mode and transmitting the signal over the transmission line.

51. An optical communication system according to claim 50, wherein a distributed feedback reflector is formed along at least part of said light waveguide to form a distributed feedback reflector type device.

52. An optical communication system according to claim 50, further comprising a distributed Bragg reflector region serially arranged with said gain region and said lossy region along a cavity direction.

53. An optical communication system according to claim 50, further comprising tuning means for tuning a wavelength independently from said first control means and said second control means.

54. An optical communication system according to claim 53, said tuning means comprising a wavelength control region arranged serially with said gain region and said lossy region, said wavelength control region including a tuning layer and a distributed Bragg reflector.

55. An optical communication system according to claim 53, said tuning means comprising a wavelength tuning layer formed in parallel with said gain region and said lossy region, and further comprising a distributed feedback reflector formed along a cavity direction.

56. An optical communication system according to claim 50, further comprising a phase control region.

57. An optical communication system for transmitting a signal from a transmitter side to a receiver side over a transmission line, said communication system comprising:
    an optical semiconductor filter disposed in the receiver, said semiconductor filter comprising:
        at least one gain region, said gain region including a light waveguide with an active layer which allows the two different polarization modes;
        at least one lossy region, said lossy region including a light waveguide which allows the two different polarization modes;
        first control means for controlling said gain region to control a gain spectrum of said device; and
        second control means for controlling said lossy region to control a cavity loss spectrum of said device such that a polarization dependency with respect to the two different polarization modes is imparted to the cavity loss spectrum;
    a photodetector disposed at the back of said semiconductor filter to detect the signal transmitted over the transmission line and through said filter;
    a distributed Bragg reflector region serially arranged with said gain region and said lossy region along a cavity direction; and
    tuning means for tuning a wavelength independently from said first control means and said second control means,
    said tuning means comprising a wavelength control region arranged serially with said gain region and said lossy region, said wavelength control region including a tuning layer and a distributed Bragg reflector.

58. An optical communication system for transmitting a signal from a transmitter side to a receiver side over a transmission line, said communication system comprising:
    an optical semiconductor filter disposed in the receiver, said semiconductor filter comprising:
        at least one gain region, said gain region including a light waveguide with an active layer which allows the two different polarization modes;
        at least one lossy region, said lossy region including a light waveguide which allows the two different polarization modes;
        first control means for controlling said gain region to control a gain spectrum of said device; and
        second control means for controlling said lossy region to control a cavity loss spectrum of said device such that a polarization dependency with respect to the two different polarization modes is imparted to the cavity loss spectrum;
    a photodetector disposed at the back of said semiconductor filter to detect the signal transmitted over the transmission line and through said filter;
    a distributed Bragg reflector region serially arranged with said gain region and said lossy region along a cavity direction; and
    tuning means for tuning a wavelength independently from said first control means and said second control means,
    said tuning means comprising a wavelength tuning layer formed in parallel with said gain region and said lossy region, and further comprising a distributed feedback reflector formed along a cavity direction.

59. An optical communication system for transmitting a signal from a transmitter side to a receiver side over a transmission line, said communication system comprising:

an optical semiconductor filter disposed in the receiver, said semiconductor filter comprising:
- at least one gain region, said gain region including a light waveguide with an active layer which allows the two different polarization modes;
- at least one lossy region, said lossy region including a light waveguide which allows the two different polarization modes;
- first control means for controlling said gain region to control a gain spectrum of said device; and
- second control means for controlling said lossy region to control a cavity loss spectrum of said device such that a polarization dependency with respect to the two different polarization modes is imparted to the cavity loss spectrum, and
- a photodetector disposed at the back of said semiconductor filter to detect the signal transmitted over the transmission line and through said filter;
- a phase control region.

60. An optical communication system according to claims 57, 58, or 59, wherein a distributed feedback reflector is formed along at least part of said light waveguide to form a distributed feedback reflector type device.

61. An optical communication system for transmitting a signal from a transmitter side to a receiver side over a transmission line, said communication system comprising:
- an oscillation polarization selective semiconductor device for switching an oscillation polarization mode between two different polarization modes and simultaneously transmitting two kinds of signal light waves whose polarization modes are different from each other, said semiconductor device comprising:
  - at least one gain region, said gain region including a light waveguide with an active layer which allows the two different polarization modes;
  - at least one lossy region, said lossy region including a light waveguide which allows the two different polarization modes;
  - first control means for controlling said gain region to control a gain spectrum of said device; and
  - second control means for controlling said lossy region to control a cavity loss spectrum of said device such that a polarization dependency with respect to the two different polarization modes is imparted to the cavity loss spectrum;
- a receiver for receiving the two kinds of signal light waves simultaneously; and
- tuning means for tuning a wavelength independently from said first control means and said second control means,
- said tuning means comprising a wavelength control region arranged serially with said gain region and said lossy region, said wavelength control region including a tuning layer and a distributed Bragg reflector.

62. An optical communication system for transmitting a signal from a transmitter side to a receiver side over a transmission line, said communication system comprising:
- an oscillation polarization selective semiconductor device for switching an oscillation polarization mode between two different polarization modes and simultaneously transmitting two kinds of signal light waves whose polarization modes are different from each other, said semiconductor device comprising:
  - at least one gain region, said gain region including a light waveguide with an active layer which allows the two different polarization modes;
  - at least one lossy region, said lossy region including a light waveguide which allows the two different polarization modes;
  - first control means for controlling said gain region to control a gain spectrum of said device; and
  - second control means for controlling said lossy region to control a cavity loss spectrum of said device such that a polarization dependency with respect to the two different polarization modes is imparted to the cavity loss spectrum;
- a receiver for receiving the two kinds of signal light waves simultaneously; and
- tuning means for tuning a wavelength independently from said first control means and said second control means,
- said tuning means comprising a wavelength tuning layer formed in parallel with said gain region and said lossy region, and further comprising a distributed feedback reflector formed along a cavity direction.

63. An optic communication system according to claims 61 or 62, wherein a distributed feedback reflector is formed along at least part of said light waveguide to form a distributed feedback reflector type device.

64. An optical communication system according to claims 61 or 62, further comprising a distributed Bragg reflector region serially arranged with said gain region and said lossy region along a cavity direction.

65. A modulation method for driving an oscillation polarization selective semiconductor device for switching an oscillation polarization mode between two different polarization modes, which includes at least one gain region, said gain region including a light waveguide with an active layer which allows the two different polarization modes, at least one lossy region, said lossy region including a light waveguide which allows the two different polarization modes, first control means for controlling the gain region to control a gain spectrum of the device, and second control means for controlling the lossy region to control a cavity loss spectrum of the device such that a polarization dependency with respect to the two different polarization modes is imparted to the cavity loss spectrum, said method comprising the steps of:
- adjusting current injected into the gain region or regions and a voltage applied to the lossy region such that threshold gains for the two different polarization modes are equal to each other in a stationary state;
- performing at least one of control of a density of carriers injected into the active layer in the gain region or regions by the first control means and control of a voltage applied across the lossy region by the second control means; and
- switching the oscillation polarization mode by at least one of superposing a signal on the current injected into the gain region and superposing a signal on the voltage applied across the lossy region.

66. A driving method for driving an optical semiconductor device, which includes at least one gain region, said gain region including a light waveguide with an active layer which allows the two different polarization modes, at least one lossy region, said lossy region including a light waveguide which allows the two different polarization modes, first control means for controlling the gain region to control a gain spectrum of the device, and second control means for controlling the lossy region to control a cavity loss spectrum of the device such that a polarization dependency with respect to the two different polarization modes is imparted to the cavity loss spectrum, said method comprising the steps of:
- adjusting current injected into the gain region or regions and a voltage applied to the lossy region such that threshold gains for the two different polarization modes are equal to each other in a stationary state; and performing at least one of control of a density of carriers injected into the active layer in the gain region or regions by the first control means and control of a voltage applied across the lossy region by the second control means.

67. A driving method for driving an optical semiconductor device, which includes at least one gain region, said gain region including a light waveguide with an active layer which allows the two different polarization modes, at least one lossy region, said lossy region including a light waveguide which allows the two different polarization modes, first control means for controlling the gain region to control a gain spectrum of the device, second control means for controlling the lossy region to control a cavity loss spectrum of the device such that a polarization dependency with respect to the two different polarization modes is imparted to the cavity loss spectrum, and tuning means for tuning a wavelength independently from the first control means and the second control means, said method comprising the steps of:

adjusting current injected into the gain region or regions and a voltage applied to the lossy region such that threshold gains for the two different polarization modes are equal to each other in a stationary state;

performing at least one of control of a density of carriers injected into the active layer in the gain region or regions by the first control means and control of a voltage applied across the lossy region by the second control means; and changing an effective refractive index of the light waveguide by at least one of current injection into and voltage application to the light waveguide by the tuning means.

68. A driving method for driving an optical semiconductor device, which includes at least one gain region, said gain region including a light waveguide with an active layer which allows the two different polarization modes, at least one lossy region, said lossy region including a light waveguide which allows the two different polarization modes, first control means for controlling the gain region to control a gain spectrum of the device, second control means for controlling the lossy region to control a cavity loss spectrum of the device such that a polarization dependency with respect to the two different polarization modes is imparted to the cavity loss spectrum, and tuning means for tuning a wavelength independently from the first control means and the second control means, the tuning means including a wavelength control region arranged serially with the gain region and the lossy region, the wavelength control region including a tuning layer and a distributed Bragg reflector, said method comprising the steps of:

adjusting current injected into the gain region or regions and a voltage applied to the lossy region such that threshold gains for the two different polarization modes are equal to each other in a stationary state;

performing at least one of control of a density of carriers injected into the active layer in the gain region or regions by the first control means and control of a voltage applied across the lossy region by the second control means; and changing an effective refractive index of the tuning layer by at least one of current injection into and voltage application to the tuning layer by the tuning means.

69. A driving method for driving an optical semiconductor device, which includes at least one gain region, said gain region including a light waveguide with an active layer which allows the two different polarization modes, at least one lossy region, said lossy region including a light waveguide which allows the two different polarization modes, first control means for controlling the gain region to control a gain spectrum of the device, second control means for controlling the lossy region to control a cavity loss spectrum of the device such that a polarization dependency with respect to the two different polarization modes is imparted to the cavity loss spectrum, tuning means for tuning a wavelength independently from the first control means and the second control means, the tuning means including a wavelength tuning layer formed in parallel with the gain region and the lossy region, and a distributed feedback reflector formed along a cavity direction, said method comprising the steps of:

adjusting current injected into the gain region or regions and a voltage applied to the lossy region such that threshold gains for the two different polarization modes are equal to each other in a stationary state;

performing at least one of control of a density of carriers injected into the active layer in the gain region or regions by the first control means and control of a voltage applied across the lossy region by the second control means; and changing an effective refractive index of the tuning layer by at least one of current injection into and voltage application to the tuning layer by the tuning means.

70. An optical semiconductor device comprising:

at least one gain region, said gain region giving a gain to two different polarization modes;

at least one lossy region, said lossy region being optically combined with said gain region;

first control means for making said gain region produce a gain to said two different polarization modes by injecting a current to said gain region; and second control means for controlling a cavity loss spectrum of said device such that a polarization dependency with respect to the two different polarization modes is imparted to the cavity loss spectrum by applying a reverse voltage to said lossy region.

71. An optical semiconductor device comprising:

at least one gain region, said gain region giving a gain to two different polarization modes;

at least one lossy region, said lossy region being optically combined with said gain region;

a first electrode for making said gain region produce a gain to said two different polarization modes by injecting a current to said gain region; and a second electrode for controlling a cavity loss spectrum of said device such that a polarization dependency with respect to the two different polarization modes is imparted to the cavity loss spectrum by applying a reverse voltage to said lossy region.

72. A driving method for driving an optical semiconductor device having at least one gain region, the at least one gain region giving a gain to two different polarization modes, and at least one lossy region, the at least one lossy region being optically combined with said gain region, said method comprising the steps of:

making said gain region produce a gain to said two different polarization modes by injecting a current to said gain region; and controlling a cavity loss spectrum of the device such that a polarization dependency with respect to the two different polarization modes is imparted to the cavity loss spectrum by applying a reverse voltage to said lossy region.

73. A driving method according to claim 72, further comprising the step of controlling polarization of oscillated light in said semiconductor device by controlling at least one of said current injected into said gain region or said voltage applied to said lossy region.

74. A driving method according to claim 72, further comprising the step of controlling polarization of selected light in said semiconductor device by controlling at least one of said current injected into said gain region or said voltage applied to said lossy region.

75. An optical semiconductor device comprising:
- at least one gain region, said gain region giving a gain to two different polarization modes; and
- at least one lossy region, said lossy region being optically combined with said gain region, wherein in said lossy region metal is provided at a position where electric field distribution of light exists to give a loss in the TM mode.

* * * * *

UNITED STATES PATENT AND TRADEMARK OFFICE
CERTIFICATE OF CORRECTION

PATENT NO. : 5,757,832
DATED : May 26, 1998
INVENTOR(S) : Uchida

It is certified that error appears in the above-indentified patent and that said Letters Patent is hereby corrected as shown below: ON THE TITLE PAGE,

[54] Title:

Line 3, "OPITCAL" should read --OPTICAL--.

[56] References Cited:

FOREIGN PATENT DOCUMENTS

"2159781  6/1990 Japan
 2246393 10/1990 Japan" should read
--2-159781  6/1990 Japan
  2-246393 10/1990 Japan--.

[57] ABSTRACT:

Line 2, "flter" should read --filter--.

COLUMN 1:

Line 3, "OPITCAL" should read --OPTICAL--.

COLUMN 15:

Line 66, "Aithough" should read --Although--.

UNITED STATES PATENT AND TRADEMARK OFFICE
CERTIFICATE OF CORRECTION

PATENT NO.   : 5,757,832
DATED        : May 26, 1998
INVENTOR(S)  : Uchida

It is certified that error appears in the above-identified patent and that said Letters Patent is hereby corrected as shown below:

COLUMN 23:

Line 17, "filter;" should read --filter; and--.

COLUMN 24:

Line 16, "optic" should read --optical--.

Signed and Sealed this

Eighteenth Day of May, 1999

Attest:

Q. TODD DICKINSON

*Attesting Officer*      *Acting Commissioner of Patents and Trademarks*